United States Patent
Sabnis et al.

(10) Patent No.: US 7,132,219 B2
(45) Date of Patent: Nov. 7, 2006

(54) POLYMERIC ANTIREFLECTIVE COATINGS DEPOSITED BY PLASMA ENHANCED CHEMICAL VAPOR DEPOSITION

(75) Inventors: Ram W. Sabnis, Evansville, IN (US);
Wu-Sheng Shih, Rolla, MO (US);
Douglas J. Guerrero, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 114 days.

(21) Appl. No.: 10/411,046

(22) Filed: Apr. 9, 2003

(65) Prior Publication Data

US 2003/0219541 A1    Nov. 27, 2003

Related U.S. Application Data

(63) Continuation-in-part of application No. 09/778,980, filed on Feb. 2, 2001, now abandoned.

(60) Provisional application No. 60/371,693, filed on Apr. 11, 2002.

(51) Int. Cl.
| | |
|---|---|
| G03C 5/00 | (2006.01) |
| H01L 21/31 | (2006.01) |
| H01L 21/469 | (2006.01) |
| G03F 7/11 | (2006.01) |
| B05D 3/02 | (2006.01) |

(52) U.S. Cl. .............. 430/271.1; 430/271.1; 430/315; 438/780; 427/96.1; 427/488; 427/569

(58) Field of Classification Search ............ 430/313, 430/317, 325, 271.1, 315; 427/96.1, 569, 427/488; 438/780
See application file for complete search history.

(56) References Cited

U.S. PATENT DOCUMENTS

| | | | |
|---|---|---|---|
| 3,657,113 A | | 4/1972 | Stancell et al. |
| 4,137,365 A | | 1/1979 | Wydeven et al. |
| 4,397,722 A | | 8/1983 | Haller |
| 5,137,780 A | * | 8/1992 | Nichols et al. ............ 428/336 |
| 5,169,494 A | | 12/1992 | Hashimoto et al. |
| 5,198,153 A | | 3/1993 | Angelopoulos et al. |
| 5,246,782 A | | 9/1993 | Kennedy et al. |
| 5,302,548 A | | 4/1994 | Watanabe et al. |
| 5,443,941 A | | 8/1995 | Bariya et al. |
| 5,545,588 A | | 8/1996 | Yoo |
| 5,633,210 A | | 5/1997 | Yang et al. |
| 5,733,712 A | | 3/1998 | Tanaka ...................... 430/314 |
| 5,807,790 A | | 9/1998 | Gupta et al. |
| 5,922,503 A | | 7/1999 | Spak et al. |
| 5,968,324 A | | 10/1999 | Cheung et al. |
| 5,991,081 A | * | 11/1999 | Haaland et al. ............ 359/589 |
| 6,042,997 A | | 3/2000 | Barclay et al. |
| 6,063,547 A | | 5/2000 | Ye et al. |
| 6,103,456 A | | 8/2000 | Többen et al. |
| 6,121,098 A | | 9/2000 | Strobl |
| 6,150,010 A | * | 11/2000 | Eissa ........................ 428/201 |
| 6,232,386 B1 | | 5/2001 | Vargo et al. |
| 6,251,562 B1 | | 6/2001 | Breyta et al. |
| 6,268,108 B1 | | 7/2001 | Iguchi et al. |
| 6,268,282 B1 | | 7/2001 | Sandhu et al. |
| 6,300,672 B1 | * | 10/2001 | Lee ........................... 257/641 |
| 6,309,955 B1 | | 10/2001 | Subramanian et al. |
| 6,316,165 B1 | | 11/2001 | Pavelcheck et al. |
| 6,376,152 B1 | | 4/2002 | Kawabe et al. |
| 6,426,125 B1 | | 7/2002 | Yang et al. |
| 6,428,894 B1 | | 8/2002 | Babich et al. |
| 6,444,320 B1 | | 9/2002 | Takei et al. |
| 6,576,408 B1 | | 6/2003 | Meador et al. |
| 2002/0031729 A1 | | 3/2002 | Trefonas, III et al. |
| 2002/0076642 A1 | | 6/2002 | Zampini et al. |
| 2002/0110665 A1 | | 8/2002 | Rutter, Jr. et al. |
| 2002/0120070 A1 | | 8/2002 | Hong et al. |
| 2003/0068846 A1 | * | 4/2003 | Moise et al. .............. 438/200 |
| 2004/0092089 A1 | * | 5/2004 | Thakar et al. ............. 438/585 |

FOREIGN PATENT DOCUMENTS

JP          08-64492          *    3/1996

OTHER PUBLICATIONS

Linlui et al., "A Novel CVD Polymeric Anti-Reflective Coating (PARC) for DRAM, Flash and Logic Device with 0.1 micron CoSi2 Gate", 2000, Symposium of VLSI Technology, p. 50-51.*
Elsevier Publishing, Jalal et al., "UV-Vis absorption spectroscopic studies of plasma-polymerized m-xylene thin films," pp. 108-111, Thin Solid Films 288 (1996).
Quan et al., "Significant improvement of electrical and thermal properties of low dielectric constant plasma polymerized paraxylene thin films by postdeposition $H_2$+He plasma treatment," pp. 1402-1404, Journal of Applied Physics, vol. 89, No. 2, Jan. 15, 2001.

* cited by examiner

*Primary Examiner*—Richard L. Schilling
(74) *Attorney, Agent, or Firm*—Hovey Williams LLP

(57) ABSTRACT

An improved method for applying polymeric antireflective coatings to substrate surfaces and the resulting precursor structures are provided. Broadly, the methods comprise plasma enhanced chemical vapor depositing (PECVD) a polymer on the substrate surfaces. The most preferred starting monomers are 4-fluorostyrene, 2,3,4,5,6-pentafluorostyrene, and allylpentafluorobenzene. The PECVD processes comprise subjecting the monomers to sufficient electric current and pressure so as to cause the monomers to sublime to form a vapor which is then changed to the plasma state by application of an electric current. The vaporized monomers are subsequently polymerized onto a substrate surface in a deposition chamber. The inventive methods are useful for providing highly conformal antireflective coatings on large surface substrates having super submicron (0.25 μm or smaller) features. The process provides a much faster deposition rate than conventional chemical vapor deposition (CVD) methods, is environmentally friendly, and is economical.

72 Claims, 15 Drawing Sheets

2-Fluorotoluene

3-Ethyltoluene n=1.65 and k=0.37

Reflectivity curve for O-xylene n=1.623 and k=0.334

POLYMERIC ANTIREFLECTIVE COATINGS DEPOSITED BY PLASMA ENHANCED CHEMICAL VAPOR DEPOSITION

RELATED APPLICATIONS

This application claims the priority benefit of a provisional application entitled POLYMERIC ANTIREFLECTIVE COATINGS DEPOSITED BY PLASMA ENHANCED CHEMICAL VAPOR DEPOSITION, Serial No. 60/371,693, filed Apr. 11, 2002, incorporated by reference herein. This application is a continuation-in-part of application Ser. No. 09/778,980, filed Feb. 2, 2001 now abandoned, entitled POLYMERIC ANTIREFLECTIVE COATINGS DEPOSITED BY PLASMA ENHANCED CHEMICAL VAPOR DEPOSITION and incorporated by reference herein.

BACKGROUND OF THE INVENTION

1. Field of Invention

The present invention is broadly concerned with methods of forming antireflective coating layers on silicon and dielectric materials as well as the resulting integrated circuit precursor structures. More particularly, the inventive methods comprise providing a quantity of a polymer generated by the subliming of monomers into the plasma state by electric current and subsequent polymerization thereof onto the surface of a substrate.

2. Background of the Prior Art

Integrated circuit manufacturers are consistently seeking to maximize silicon wafer sizes and minimize device feature dimensions in order to improve yield, reduce unit case, and increase on-chip computing power. Device feature sizes on silicon chips are now submicron in size with the advent of advanced deep ultraviolet (DUV) microlithographic processes. However, reducing the substrate reflectivity to less than 1% during photoresist exposure is critical for maintaining dimension control of such submicron features. Therefore, light absorbing organic polymers known as antireflective coatings are applied beneath photoresist layers in order to reduce the reflectivity normally encountered from the semiconductor substrates during the photoresist DUV exposure.

These organic antireflective layers are typically applied to the semiconductor substrates by a process called spincoating. While spincoated antireflective layers offer excellent reflectivity control, their performance is limited by their nonuniformity, defectivity and conformality constrictions, and other inefficiencies inherent within the spincoating process. As the industry approaches the adoption of eight-inch or even twelve-inch semiconductor substrates, the inherent inefficiencies of the spincoating process become magnified.

When spincoated at thicknesses ranging from 500 Å to 2500 Å, commercial organic antireflective coating layers require polymers specifically designed to prevent molecular intermixing with adjacent photoresist layers coated and baked thereon. Although high optical density at DUV wavelengths enable these pre-designed polymers to provide effective reflectivity control at prior art dimensions, they have numerous drawbacks.

Another problem with the currently available antireflective coating application processes is inadequate planarization. Organic antireflective coatings are usually formed by spincoating. The formed layers typically lack uniformity in that the thickness at the edge of the substrate is greater than the thickness at the center. Furthermore, spincoated antireflective coating layers tend to planarize or unevenly coat surface topography rather than form highly conformal layers (i.e., layers which evenly coat each aspect of the substrate and the features). For example, if an antireflective coating layer with a nominal layer thickness of 1000 Å is spincoated over raised features having feature heights of 0.25 µm, the layer may prove to be only 350 Å thick on top of the features, while being as thick as 1800 Å in the troughs located between the raised features. When planarization occurs with these ultramicroscopic feature sizes, the antireflective coating layer is too thin on the top of the features to provide the desired reflection control at the features. At the same time, the layer is too thick in the troughs to permit efficient layer removal during subsequent plasma etch. That is, in the process of clearing the antireflective coating from the troughs by plasma etch, the sidewalls of the resist features become eroded, producing microscopically-sized— but significant—changes in the feature shape and/or dimensions. Furthermore the resist thickness and edge acuity may be lost, which can lead to inconsistent images or feature patterns as the resist pattern is transferred into the substrate during subsequent etching procedures.

Other problems can occur as well due to the fact that spincoating of these ultra-thin antireflective coating layers takes place at very high speeds in a dynamic environment. Accordingly, pinholes, voids, striations, bubbles, localized poor adhesion, center-to-edge thickness variations, and other defects occur as a consequence of attendant rapid or non-uniform solvent evaporation, dynamic surface tension, and liquid-wavefront interaction with surface topography. The defects stemming therefrom become unacceptable with increased wafer size (e.g., eight- to twelve-inch wafers) and when patterning super submicron (e.g., 0.25 µm or smaller) features.

There is a need for an improved process of depositing antireflective coatings on various substrates. This process should overcome the above-mentioned drawbacks while providing for rapid deposition of the antireflective coatings.

SUMMARY OF THE INVENTION

The present invention overcomes these problems by broadly providing improved methods of applying antireflective coatings to silicon wafers, dielectric materials, and other substrates (e.g., silicon, aluminum, tungsten, tungsten silicide, gallium arsenide, germanium, tantalum, tantalum nitrite, mixed metal salts, SiGe, and other reflective surfaces) utilized in microelectronics (semiconductor and circuit manufacturing processes), optoelectronics (display devices), photonics (optical waveguides), and microelectromechanical systems (MEMS).

In more detail, the inventive methods preferably comprise converting a quantity of an antireflective compound (which can be in the solid, liquid, or gas state) into a plasma state by applying an electric current to the compound under pressure. This is preferably accomplished by increasing the pressure of the system to a level of from about 50-200 mTorr, more preferably from about 70-150 mTorr, and even more preferably from about 95-100 mTorr. As the pressure is being increased, an electric current of from about 0.1-10 amps, preferably from about 0.5-8 amps, and more preferably from about 1-1.5 amps is then applied to the compound. For compounds having a boiling or melting point of greater than about 100° C., slight heating may be necessary as the current is applied.

The deposition of the layer on the substrate is very rapid, much more rapid than conventional chemical vapor deposition (CVD) processes. More particularly, the layers are formed at a rate of at least about 100 Å/min., preferably at least about 130 Å/min., and more preferably from about 135-700 Å/min. on an eight-inch round substrate. It will be appreciated that this provides a significant advantage to the circuit manufacturing process.

The antireflective compound comprises one or more types of monomers which can be selected depending upon the intended application conditions. After the monomers are formed into a plasma, the monomers will polymerize and deposit in a layer on the substrate. A layer of photoresist can then be applied to the resulting antireflective layer to form a precursor structure which can then be subjected to the remaining steps of the circuit manufacturing process (i.e., applying a mask to the photoresist layer, exposing the photoresist layer to radiation at the desired wavelength, developing and etching the photoresist layer).

In one embodiment, preferred monomers comprise a light attenuating moiety and an unsaturated moiety (i.e., a group comprising at least one double bond and/or at least one triple bond), the latter of which readily reacts during the plasma enhanced chemical vapor deposition (PECVD) process to bond with other monomers as the layer polymerizes on the substrate. Preferred unsaturated moieties include alkenyl groups (preferably $C_2$-$C_{20}$) and alkynyl groups ($C_2$-$C_8$).

In another embodiment, the monomers embodiment have the formula

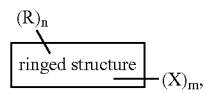

wherein:
each R is individually selected from the group consisting of alkyl groups (preferably $C_1$-$C_{20}$, more preferably $C_1$-$C_{10}$, and even more preferably $C_1$-$C_6$);
each X is individually selected from the group consisting of cyano groups, nitroso groups, and the halogens;
m is 0-10, and preferably about 1-5; and
n is about 1-12, and preferably about 1-5.

Preferred alky groups include methyl, ethyl, n-propyl, iso-propyl, n-butyl, iso-butyl, pentyl, hexyl, heptyl, octyl, nonyl, decyl, dodecyl, and amyl groups. It is preferred that the ringed structure be a light attenuating moiety.

Even more preferably the monomer has the formula

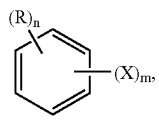

wherein:
each R is individually selected from the group consisting of alkyl groups;
each X is individually selected from the group consisting of cyano groups, nitroso groups, and the halogens;
m is 0-5;
n is 1-6; and
the sum of m and n is less than or equal to 6.

Regardless of the embodiment, preferred light attenuating moieties comprise a cyclic compound such as benzene, naphthalene, anthracene, acridine, furan, thiophene, pyrrole, pyridine, pyridazine, pyrimidine, pyrazine, thiazine, oxazine, thiazole, oxazole, pyrazole, oxadiazole, quinazoline, and quinoxaline moieties. Even more preferably, the light attenuating moiety further comprises a cyano group, a nitroso group, and/or a halogen.

The monomers should have a melting or boiling point of less than about 450° C., preferably less than about 200° C., more preferably less than about 150° C., and even more preferably from about 10-100° C. Melting or boiling points of less than about 100° C. result in an improved deposition rate.

Thus, preferred monomers for use in the inventive processes are those selected from the group consisting of styrene and substituted derivatives thereof (e.g., alkoxystyrenes, alkylstyrenes, halostyrenes, aminostyrenes, acetamidostyrenes, and nitrostyrenes), allylbenzene and substituted derivatives thereof (e.g., alkoxybenzenes, alkylbenzenes, halobenzenes, aminobenzenes, acetamidobenzenes, and nitrobenzenes), and xylene and toluene and derivatives thereof e.g., halotoluenes, alkyltoluenes, haloxylenes, halonitrotoluenes). Particularly preferred monomers include 2-methoxystyrene, 3-methoxystyrene, 4-methoxystyrene, 2-methylstyrene, 3-methylstyrene, 4-methylstyrene, 2-fluorostyrene, 3-fluorostyrene, 4-fluorostyrene, 2-bromostyrene, 3-bromostyrene, 4-bromostyrene, 2-chlorostyrene, 3-chlorostyrene, 4-chlorostyrene, 2-nitrostyrene, 3-nitrostyrene, 4-nitrostyrene, 3,5-bis(trifluoromethyl)styrene, trans-2-chloro-6-fluoro-β-nitrostyrene, decafluoroallylbenzene, 2,6-difluorostyrene, ethyl 7-[1-(4-fluorophenyl)-4-isopropyl-2-phenyl-1H-imidazol-5-yl)-5-hydroxy-3-oxo-trans-6-heptenoate, flunarizine dihydrochloride, trans-4-fluoro-β-nitrostyrene, 2-fluorostyrene, 3-fluorostyrene, β-nitro-4-(trifluoromethoxy)styrene, trans-β-nitro-2-(trifluoromethyl) styrene, trans-13-nitro-3-(trifluoromethyl)styrene, β-nitro-4-(trifluoromethyl)styrene, trans-2,3,4,5,6-pentafluoro-β-nitrostyrene, trans-1,1,1-trifluoro-4-(3-indolyl)-3-buten-2-one, a-(trifluoromethyl)-styrene, 2-(trifluoromethyl)styrene, 3-(trifluoromethyl)styrene, 4-(trifluoromethyl)-styrene, 3,3,3-trifluoro-1-(phenylsulfonyl)-1-propene, 2-fluorotoluene, 3-fluorotoluene, 4-fluorotoluene, 2-chlorotoluene, 3-chlorotoluene, 4-chlorotoluene, 2-bromotoluene, 3-bromotoluene, 4-bromotoluene, 2-iodotoluene, 3-iodotoluene, 4-iodotoluene, 2-ethyltoluene, 3-ethyltoluene, 4-ethyltoluene, 2-methoxytoluene, 3-methoxytoluene, 4-methoxytoluene, 3-nitrotoluene, 3-nitrotoluene, 4-nitrotoluene, o-xylene, m-xylene, p-xylene, 2-bromo-m-xylene, 2-bromo-p-xylene, 3-bromo-o-xylene, 4-bromo-o-xylene, 4-bromo-m-xylene, 5-bromo-m-xylene, 4-tert-butyltoluene, 4-tert-butyl-o-xylene, 5-tert-butyl-m-xylene, 2-chloro-3-nitrotoluene, 2-chloro-4-nitrotoluene, 2-chloro-6-nitrotoluene, 3-chloro-4-nitrotoluene, 4-chloro-2-nitrotoluene, 4-chloro-3-nitrotoluene, 5-chloro-2-nitrotoluene, 2-fluoro-4-nitrotoluene, 2-fluoro-5-nitrotoluene, 2-fluoro-6-nitrotoluene, 3-fluoro-4-nitrotoluene, 4-fluoro-2-nitrotoluene, 5-fluoro-2-nitrotoluene, 2-fluoro-m-xylene, 3-fluoro-o-xylene, 2-chloro-m-xylene, 2-chloro-p-xylene, 3-chloro-o-xylene, and 4-chloro-o-xylene.

The resulting precursor structures have antireflective coating layers which are surprisingly defect-free. Thus, there are less than about 0.1 defects/cm² of antireflective layer (i.e., less than about 15 defects per 8-inch wafer), and preferably less than about 0.05 defects/cm² (i.e., less than about 7.5 defects per 8-inch wafer), when observed under an optical microscope. Furthermore, these essentially defect-free films can be achieved on 6-12 inch substrates having super submicron features (less than about 0.25 μm in height). As used herein, the term "defects" is intended to include pinholes, dewetting problems where the film doesn't coat the surface, and so-called "comets" in the coating where a foreign particle contacts the substrate surface causing the coating to flow around the particle.

The antireflective layers prepared according to the invention can be formulated to have a thickness of anywhere from about 100-5000 Å, and preferably 300-5000 Å, and can also be tailored to absorb light at the wavelength of interest, including light at a wavelength of from about 150-500 nm (e.g., 365 nm or i-line wavelengths, 435 nm or g-line wavelengths, 248 nm deep ultraviolet wavelengths, and 193 nm wavelengths), preferably from about 190-300 nm. Thus, the antireflective layers will absorb at least about 90%, and preferably at least about 95%, of light at wavelengths of from about 150-500 nm. Furthermore, the antireflective layers have a k value (the imaginary component of the complex index of refraction) of at least about 0.1, preferably at least about 0.35, and more preferably at least about 0.4, and an n value (the real component of the complex index of refraction) of at least about 1.1, preferably at least about 1.5, and more preferably at least about 1.6 at the wavelength of interest (e.g., 193 nm).

The deposited antireflective layer is also substantially insoluble in solvents (e.g., ethyl lactate, propylene glycol monomethyl ether acetate) typically utilized in the photoresist layer which is subsequently applied to the antireflective layer. That is, the thickness of the layer will change by less than about 10%, and preferably less than about 5% after contact with the photoresist solvent. As used herein, the percent change is defined as:

$$100 \cdot \frac{|(\text{thickness prior to solvent contact}) - (\text{thickness after solvent contact})|}{(\text{thickness prior to solvent contact})}$$

1001 (thickness prior to solvent contact)-(thickness after solvent contact! (thickness prior to solvent contact)

The antireflective layers deposited on substrate surfaces according to the invention are also highly conformal, even on topographic surfaces (as used herein, surfaces having raised features of 1000 Å or greater and/or having contact or via holes formed therein and having hole depths of from about 1000-15,000 Å). Thus, the deposited layers have a percent conformality of at least about 85%, preferably at least about 95%, and more preferably about 100%, wherein the percent conformality is defined as:

$$100 \cdot \frac{|(\text{thickness of the film at location } A) - (\text{thickness of the film at location } B)|}{(\text{thickness of the film at location } A)},$$

100 (thickness of the film at location A)-(thickness of the film at location B) (thickness of the film at location A), wherein: "A" is the centerpoint of the top surface of a target feature when the target feature is a raised feature, or the centerpoint of the bottom surface of the target feature when the target feature is a contact or via hole; and "B" is the halfway point between the edge of the target feature and the edge of the feature nearest the target feature. When used with the definition of percent conformality, "feature" and "target feature" is intended to refer to raised features as well as contact or via holes. As also used in this definition, the "edge" of the target feature is intended to refer to the base of the sidewall forming the target feature when the target feature is a raised feature, or the upper edge of a contact or via hole when the target feature is a recessed feature.

Finally, in addition to the aforementioned antireflective layer properties, the instant invention has a further distinct advantage over prior art spincoating methods which utilize large quantities of solvents. That is, the instant methods avoid spincoating solvents which often require special handling. Thus, solvent waste is minimized and so are the negative effects that solvent waste can have on the environment. Furthermore, overall waste is minimized with the inventive process wherein substantially all of the reactants are consumed in the process.

DETAILED DESCRIPTION OF THE PREFERRED EMBODIMENTS

EXAMPLES

Figure 1:
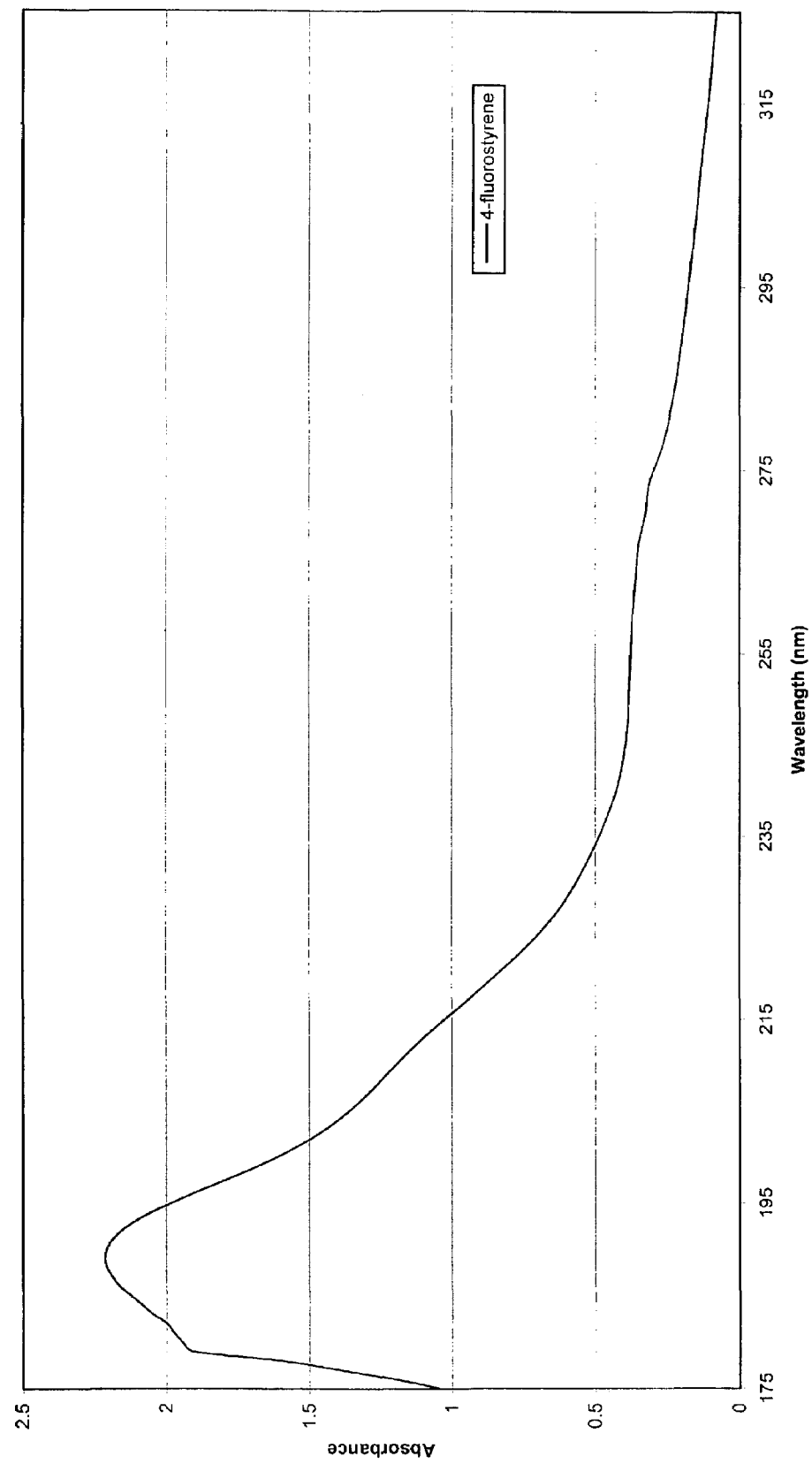
FIG. 1 is a graph depicting the ultraviolet-visible (UV-Vis) spectrum of a 4-fluorostyrene film deposited on a quartz slide by the inventive PECVD process.

The following examples set forth preferred methods in accordance with the invention. It is to be understood, however, that these examples are provided by way of illustration and nothing therein should be taken as a limitation upon the overall scope of the invention.

Materials and Methods

Examples 1-3

The PECVD process to which the antireflective compounds were subjected in the following Examples 1-3 involved subjecting the compounds to sufficient electric current and pressure so as to cause the solid or liquid compounds to form a plasma. The monomers to be deposited were initially weighed in a glass vial (generally around 0.2 g). The vial containing the monomers was attached (via a rubber stopper) to a quartz chamber connected to a stainless steel pipe, with flow through the steel pipe being controlled by a needle valve. The quartz chamber was surrounded by an RF coil which, in turn, was connected to an RF generator. The RF generator generated the electric current in the quartz chamber through the RF coil. The quartz chamber was also connected to a deposition chamber in which the substrates were loaded.

The deposition chamber and quartz chamber were evacuated by pressure (usually around 20-100 mTorr, preferably around 30-50 mTorr). The monomers to be deposited were kept in the glass vial. If the melting points or boiling points of the monomers were less than 100° C., pressure of 40-80 mTorr alone was sufficient to effect sublimation. However, if the melting points or boiling points of the monomers were greater than 100° C., pressure of 40-80 mTorr in conjunction with a slight heating was required to cause their sublimation.

The needle valve was then opened by ¼ of a turn (it took 8 full turns to open the needle valve completely). The pressure inside the deposition chamber increased because the glass vial was not under vacuum. As the glass vial was evacuated and the pressure inside the deposition chamber increased to 95 mTorr, the RF plasma was turned on. The pressure during deposition was typically between 70-150 mTorr. The RF plasma power was set around 50-300 watts (preferably about 70-150 watts, and more preferably about 80 watts), and the mode was pulsed (i.e. in on/off mode, not continuous) at a duty cycle of 30% and pulse duration of 300 msec. The monomers were in a plasma state in the quartz chamber, and then polymerized and deposited on the substrate (six- or eight-inch flat wafers) in the deposition chamber. The substrate was rotated at 2 rpm in order to ensure a uniform coat.

Example 1

Deposition of 4-Fluorostyrene

The antireflective coating layers were prepared by PECVD polymerizing a 0.2 g sample of 4-fluorostyrene (Structure A, obtained from Sigma-Aldrich) onto six- or eight-inch flat silicon wafers, topography wafers, quartz slides, aluminum substrates, tantalum (Ta) substrates, and tantalum nitride (TaN) substrates. Before deposition, the pressure was about 40 mTorr. During deposition, the pressure was maintained around 95-100 mTorr, and the temperature was room temperature (about 23° C.). The RF plasma power was set at 80 watts and cycled as discussed above. An initial eight runs on flat substrates were conducted to determine the best film thicknesses, optical properties, film uniformity, intermixing with photoresists, resistance to resist solvents, and adhesion to the various substrates. The topography wafers were used to determine conformal properties. The 4-fluorostyrene deposited at a rate of 136 Å/min. on an eight-inch substrate. This deposition time was much shorter than that of CVD processes. The structure of the resulting polymer is shown in Structure B.

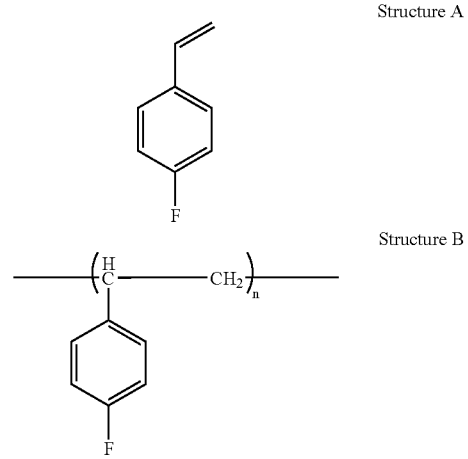

The film thickness was optically measured by ellipsometry at 25 points on a planar silicon wafer to estimate the mean thickness. The films had uniform coating, without pinholes, voids or particles, with a preferred thickness of 1000 Å. The films exhibited a thickness uniformity of >98% on the various substrates. The film thickness uniformity data is set forth in Table 1.

TABLE 1

| | Film Thickness Uniformity | |
|---|---|---|
| Mean Thickness (Å) | Standard Deviation (Å) | Thickness Uniformity (%) |
| 3895 | 130 | 2.01 |

The deposited antireflective layer was also substantially insoluble in ethyl lactate. That is, very little thickness loss was observed using ethyl lactate. The stripping data is set forth in Table 2.

TABLE 2

| | Stripping Test | | |
|---|---|---|---|
| Solvent | Initial Thickness (Å) | Final Thickness (Å) | Stripping Estimate (%) |
| Ethyl lactate | 3895 | 3852 | 1.10 |

FIG. 1 depicts the ultraviolet-visible (UV-Vis) spectrum of the deposited film according to this example (i.e., using 4-fluorostyrene deposited on a quartz slide). The λmax was at 189 nm, thus demonstrating that 4-fluorostyrene-based antireflective films deposited by PECVD processes are useful for 193 nm applications. The optical density was 14.4/μm at 193 nm.

Figure 2:
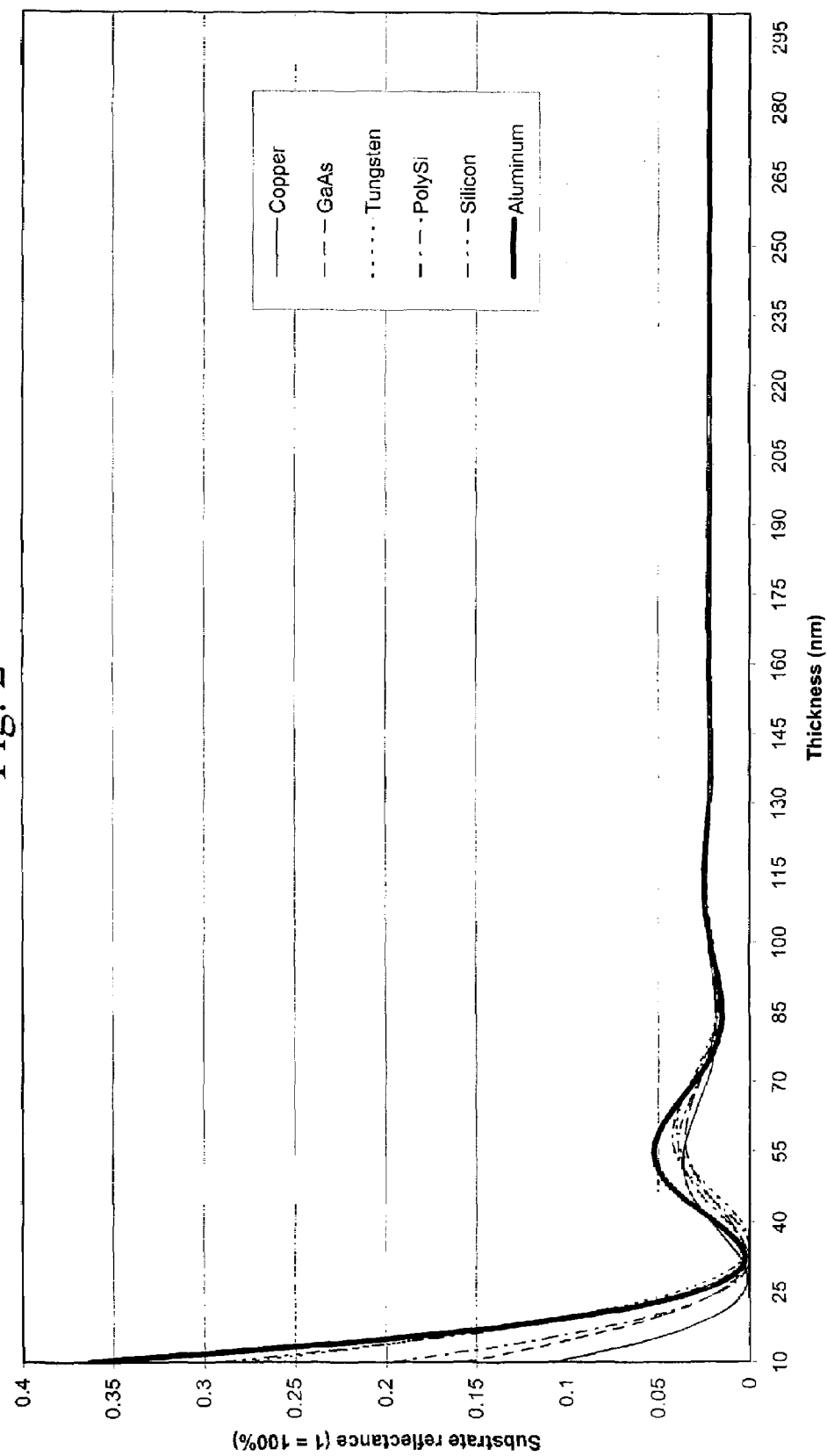
FIG. 2 is a graph showing the reflectance curve of a 4-fluorostyrene film deposited on various substrates by the inventive PECVD process.

The optical constants were measured by VASE (variable angle spectroscopic ellipsometry) analysis. The average n value (the real component of the complex index of refraction) and the average k value (the imaginary component of the complex index of refraction) were determined. The values were n=1.71 and k=0.59 at 193 nmr. The optical density calculated from the optical constants was 14.4/μm at 193 nm. FIG. 2 shows the reflectance curve of the 4-fluorostyrene film prepared in this examples as deposited on the various substrates. The first minimum thickness was 350 Å, and the second minimum thickness was 900 Å.

Figure 3:
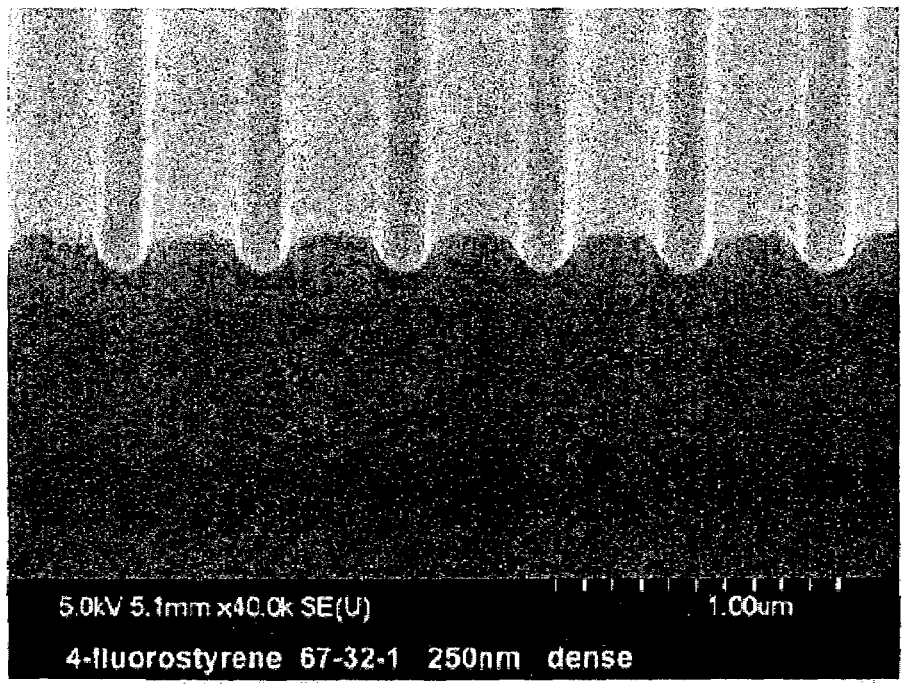
FIG. 3 is a scanning electron microscope (SEM) photograph showing the film conformality of a 1940 Å thick, 4-fluorostyrene film deposited on 1000 Å topography by the inventive PECVD process.

The film conformality was tested by depositing the 4-fluorostyrene on 1000 Å topography wafers. An examination of the scanning electron microscope (SEM) photograph indicated that the film was nearly 96% conformal to the substrates over a topography of 1000 Å in height. FIG. 3 is an SEM photograph showing the film conformality of a 1940 Å thick film of 4-fluorostyrene on a 1000 Å topography.

Figure 4:
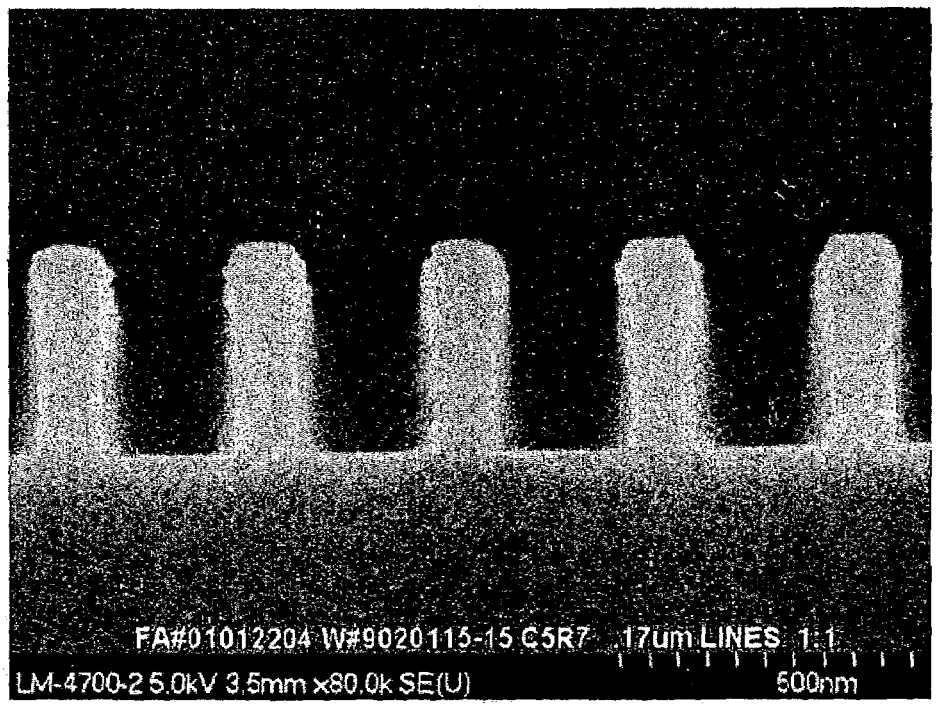
FIG. 4 is an SEM photograph showing the resist profile cross-section of a 4-fluorostyrene film deposited by the inventive PECVD process and utilizing a commercially available photoresist.

The 4-fluorostyrene was plasma vapor deposited on a silicon wafer to form a film having a thickness of 1077 Å, followed by patterning of a PAR-710 photoresist (obtained from Sumitomo Chemical Co.) over the antireflective coating film, and developing with CD-26 (obtained from Shipley Company, Inc.). The wafers were then cross-sectioned, and the resist features were examined with an SEM. FIG. 4 is an SEM photograph showing the excellent resist profile cross-section of this sample. Resist profiles as small as 170 nm dense lines and 170 nm isolated lines were achieved.

Example 2

Deposition of 2,3,4,5,6-Pentafluorostyrene

The antireflective coating layers were prepared by PECVD polymerizing a 0.2 g sample of 2,3,4,5,6-pentafluorostyrene (Structure C, obtained from Sigma-Aldrich) on six- or eight-inch flat silicon wafers, topography wafers, quartz slides, aluminum substrates, tantalum (Ta) substrates, and tantalum nitride (TaN) substrates. Before deposition, the pressure was about 40 mTorr. During deposition, the pressure was maintained around 95-100 mTorr, and the temperature was room temperature (about 23° C.). The RF plasma power was set at 80 watts and cycled as discussed above. An initial eight runs on flat substrates were conducted to determine the best film thicknesses, optical properties, film uniformity, intermixing with photoresists, resistance to resist solvents, and adhesion to the various substrates. Topography wafers were used to determine conformal properties. The PECVD rate was 667 Å/min. on an eight-inch substrate, which is a much quicker deposition rate than that achieved with standard CVD processes. The structure of the resulting polymer is shown in Structure D.

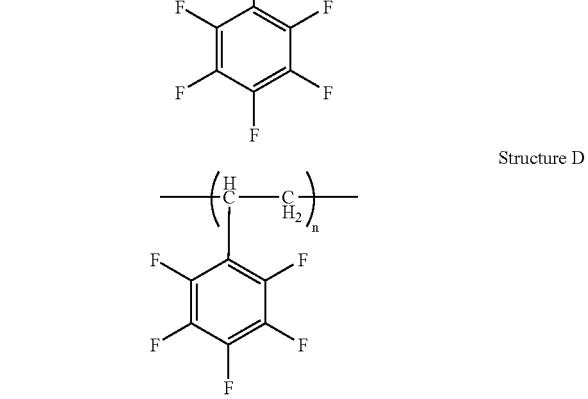

Structure C

Structure D

The film thickness was optically measured by ellipsometry at 25 points on a planar silicon wafer to estimate the mean thickness. The films generated uniform coats, without pinholes, voids or particles and having a preferred thickness of 1000 Å. The films exhibited a thickness uniformity of >92% on the various substrates. The film thickness uniformity data is set forth in Table 3.

TABLE 3

| | Film Thickness Uniformity | |
|---|---|---|
| Mean Thickness (Å) | Standard Deviation (Å) | Thickness Uniformity (%) |
| 1385 | 165 | 7.2 |

The deposited antireflective layer was also substantially insoluble in typical photoresist solvents (e.g., ethyl lactate). The stripping data is set forth in Table 4.

TABLE 4

| | Stripping Test | | |
|---|---|---|---|
| Solvent | Initial Thickness (Å) | Final Thickness (Å) | Stripping Estimate (%) |
| Ethyl lactate | 1385 | 1315 | 5.05 |

Figure 5:
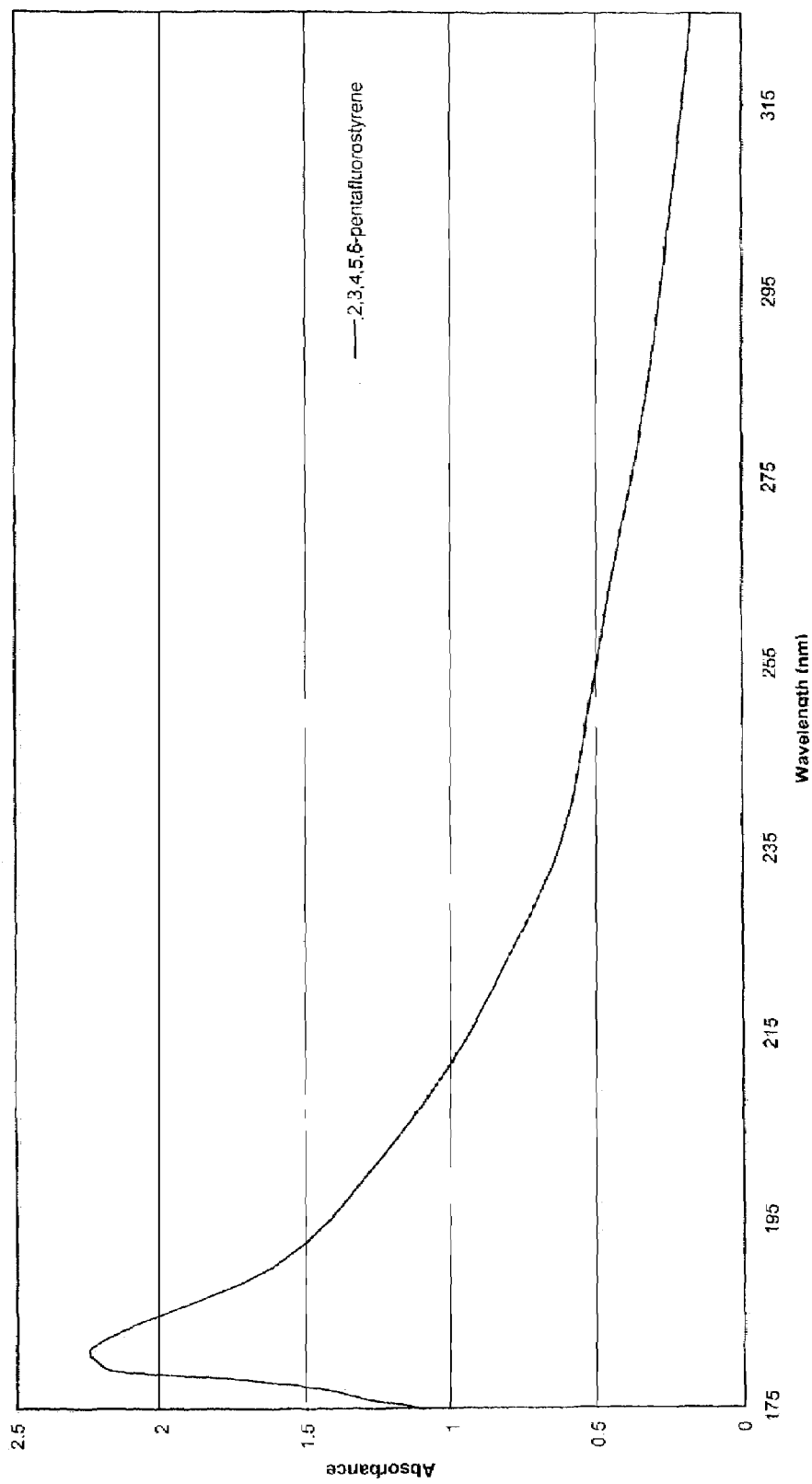
FIG. 5 is a graph depicting the UV-Vis spectrum of a 2,3,4,5,6-pentafluorostyrene film deposited on a quartz slide by the inventive PECVD process.

FIG. 5 is a graph which depicts the UV-Vis spectrum of the film deposited on a quartz slide according to this example. The $\lambda_{max}$ was at 181 nm, thus demonstrating that 2,3,4,5,6-pentafluorostyrene-based antireflective films are useful for 193 nm applications. The optical density was 4.33 μm at 193 nm.

Figure 6:
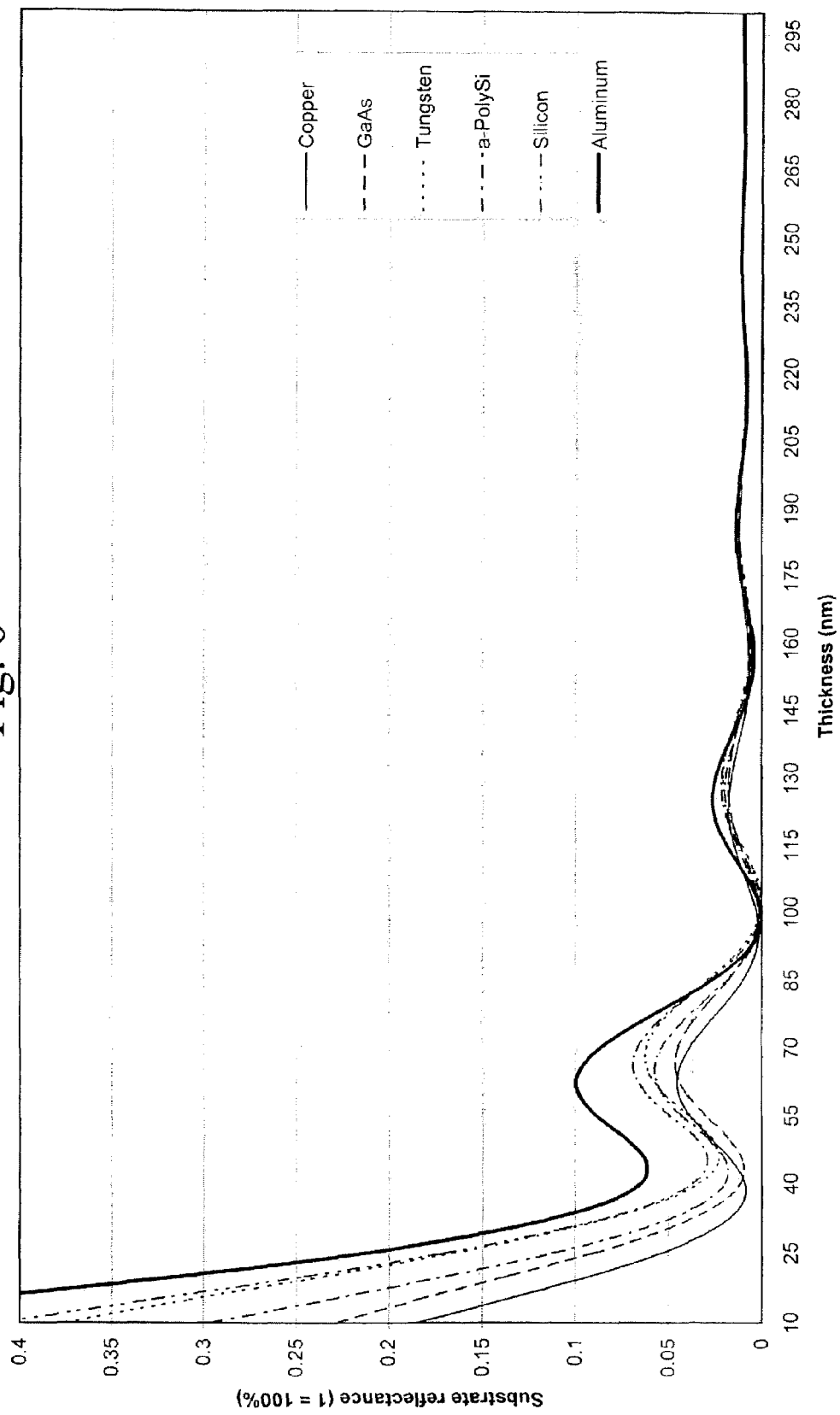
FIG. 6 is a graph showing the reflectance curve of a 2,3,4,5,6-pentafluorostyrene film deposited on various substrates by the inventive PECVD process.

The optical constants were measured by VASE analysis. At 193 nm, the average n value was 1.62, and the average k was 0.31. The optical density calculated from the optical constants was 4.33/μm at 193 nm. FIG. 6 shows the reflectance curve of this sample when deposited on the various substrates. The first minimum thickness was 450 Å, and the second minimum thickness was 1000 Å.

Figure 7:
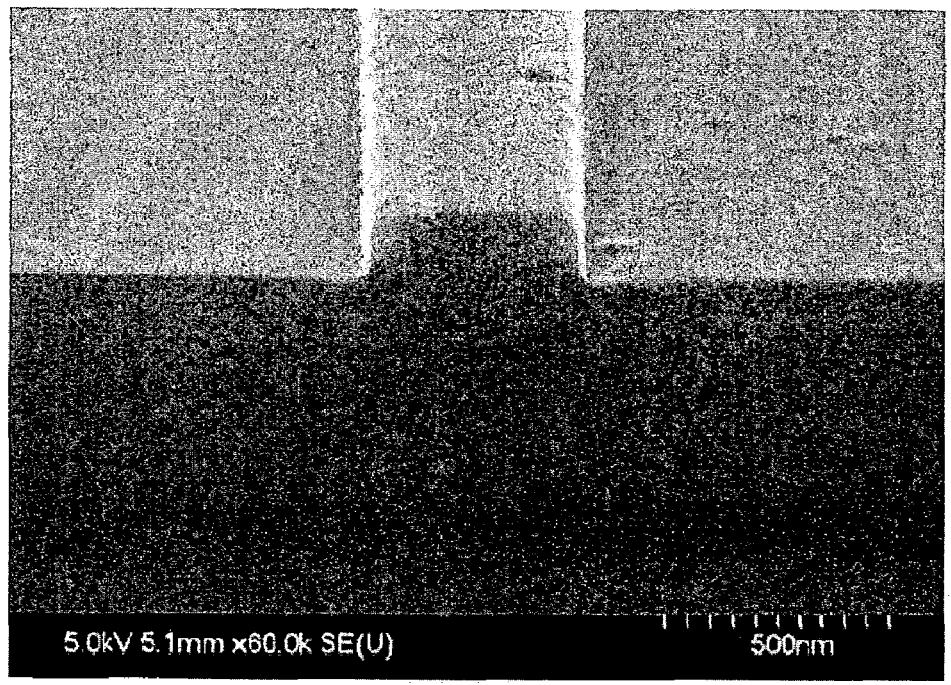
FIG. 7 is an SEM photograph showing the film conformality of a 1735 Å thick, 2,3,4,5,6-pentafluorostyrene film deposited on 1000 Å topography by the inventive PECVD process.

The film conformality was tested by PECVD depositing 2,3,4,5,6-pentafluorostyrene on 1000 Å topography wafers. An examination of the SEM photograph indicated that the film was nearly 97% conformal to the substrates over a topography of 1000 Å in height. FIG. 7 is an SEM photograph showing the film conformality of a 1735 Å thick film of 2,3,4,5,6-pentafluorostyrene on a 1000 Å topography.

Example 3

Deposition of Allylpentafluorobenzene

The antireflective coating layers was prepared by PECVD polymerizing a 0.2 g sample of allylpentafluorobenzene (Structure E, obtained from Sigma-Aldrich) on six- or eight-inch flat silicon wafers, topography wafers, quartz slides, aluminum substrates, tantalum (Ta) substrates, and tantalum nitride (TaN) substrates. Before deposition, the pressure was about 40 mTorr. During deposition, the pressure was maintained around 95-100 mTorr, and the temperature was room temperature (about 23° C.). The RF plasma power was set at 80 watts and cycled as discussed above. An initial eight runs on flat substrates were conducted to determine the best film thicknesses, optical properties, film uniformity, intermixing with photoresists, resistance to resist solvents, and adhesion to the various substrates. Topography wafers were used to determine conformal properties. The PECVD rate was 525 Å/min on an eight-inch substrate which is much faster than that of standard CVD processes. The structure of the resulting polymer is shown in Structure F.

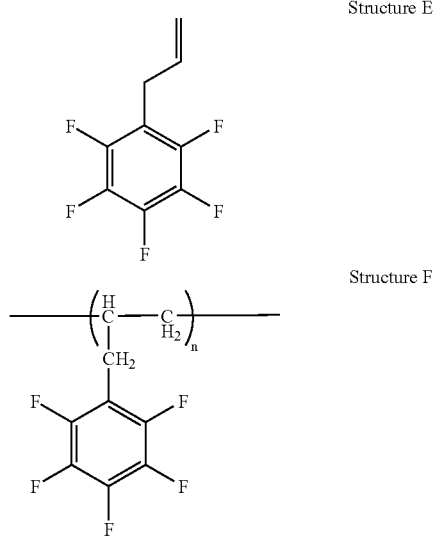

Structure E

Structure F

The film thickness was optically measured by ellipsometry at 25 points on the planar silicon wafer to estimate the mean thickness. The films generated uniform coats, without pinholes, voids or particles, and having a preferred thickness of 1000 Å. The films had a thickness uniformity of >96% on the various substrates. The film thickness uniformity data is set forth in Table 5.

TABLE 5

| Film Thickness Uniformity | | |
|---|---|---|
| Mean Thickness (Å) | Standard Deviation (Å) | Thickness Uniformity (%) |
| 5140 | 283 | 3.37 |

The deposited antireflective layer was-also substantially insoluble in typical photoresist solvents. No thickness loss was observed using ethyl lactate. The stripping data is set forth in Table 6.

TABLE 6

| Striping Test | | | |
|---|---|---|---|
| Solvent | Initial Thickness (Å) | Final Thickness (Å) | Stripping Estimate (%) |
| Ethyl lactate | 5140 | 5173 | 0.00 |

Figure 8:
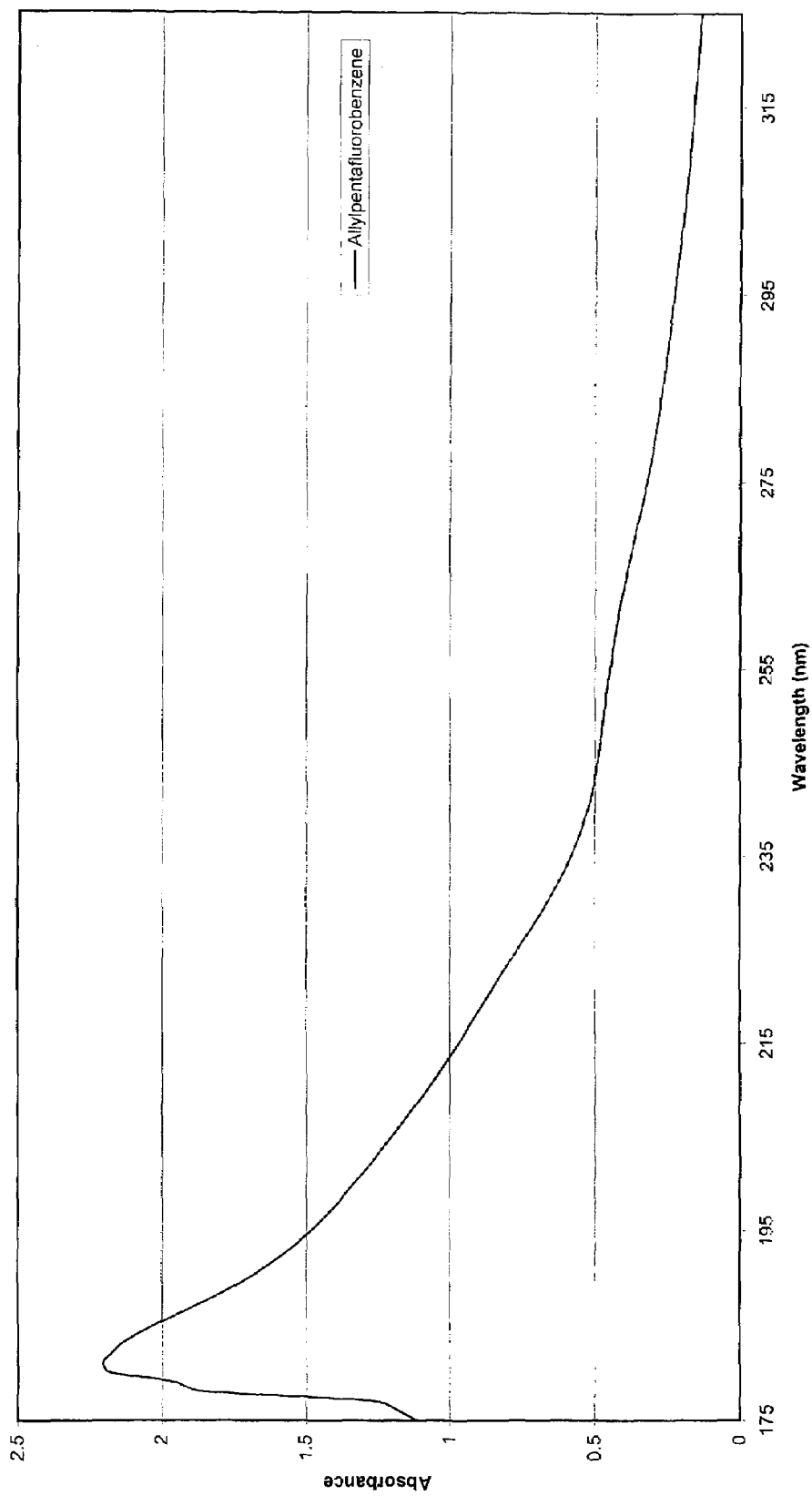
FIG. 8 is a graph depicting the UV-Vis spectrum of a allylpentafluorobenzene film deposited on a quartz slide by the inventive PECVD process.

FIG. 8 is a graph showing the UV-Vis spectrum of the film deposited on a quartz slide according to this example. The $\lambda_{max}$ was at 181 nm, thus demonstrating that allylpentafluorobenzene-based antireflective films are useful for 193 nm applications. The optical density was 9.55/μm at 193 nm.

Figure 9:
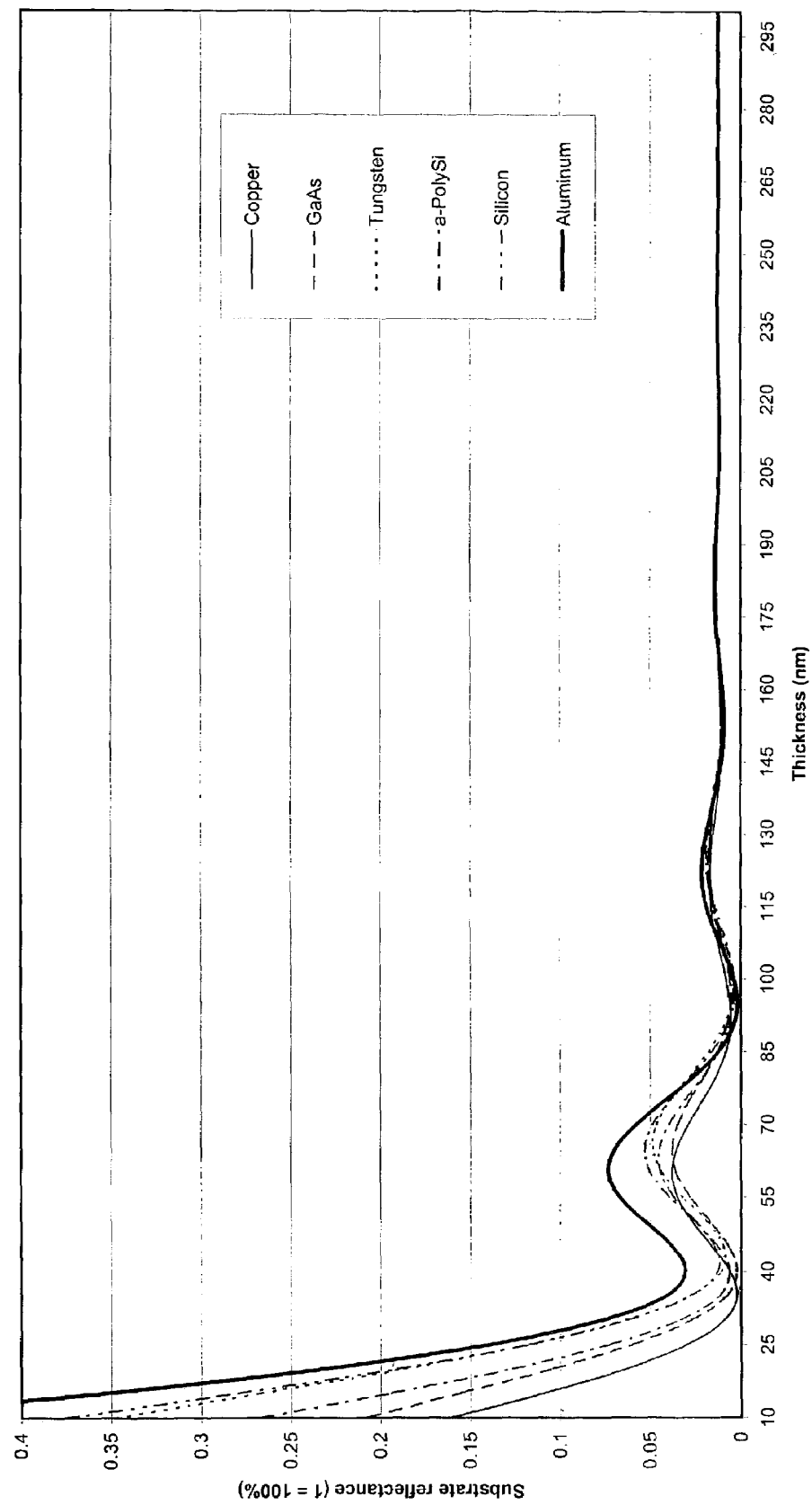
FIG. 9 is a graph showing the reflectance curve of a allylpentafluorobenzene film deposited on various substrates by the inventive PECVD process.

The optical constants were measured by VASE analysis. At 193 nm, the average n value was 1.64, and the average k value was 0.34. The optical density calculated from the optical constants at 193 nm was 9.55/μm. FIG. 9 depicts the reflectance curve of this sample deposited on the various substrates. The first minimum thickness was 400 Å, and the second minimum thickness was 950 Å.

Figure 10:
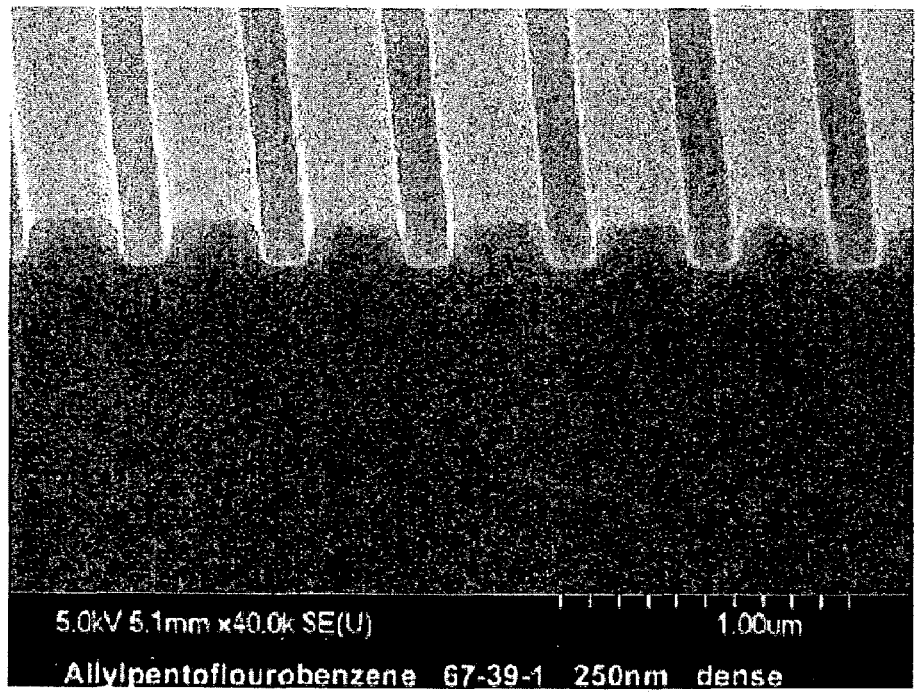
FIG. 10 is an SEM photograph showing the film conformality of a 1698 Å thick, allylpentafluorobenzene film deposited on 1000 Å topography by the inventive PECVD process.

The film conformality was tested by PECVD depositing allylpentafluorobenzene on 1000 Å topography wafers. An examination of the SEM photograph indicated that the film was nearly 96% conformal to the substrates over a topography of 1000 Å in height. FIG. 10 is an SEM photograph showing the film conformality of the 1698 Å thick film of allylpentafluorobenzene on a 1000 Å topography.

It will be appreciated that the superior method of depositing antireflective coating layers by plasma enhanced chemical vapor deposition has distinct advantages over the prior art spincoating methods which utilize large quantities of solvents. That is, the instant methods avoid the spincoating solvents which often require special handling. Thus, solvent waste is minimized and so are the negative effects that the solvent waste can have on health and the environment. Furthermore, overall waste is minimized with the inventive process wherein substantially all of the reactants are consumed in the process. Thus, the methods of present invention are lower in cost than most prior art methods and are also environmentally friendly. The PECVD methods also have a much faster deposition rate (i.e., less time is required to deposit the films) as compared to conventional CVD methods.

Materials and Methods

Examples 4-9

The methods followed for Examples 4-9 involved increasing the pressure of the system to a level of from about 5-200 mTorr, more preferably from about 25-150 mTorr, and even more preferably from 25-100 mTorr. The RF plasma power is preferably set at around 10-300 watts, more preferably about 15-150 watts, and even more preferably about 20-80 watts, and the mode was pulsed (i.e., on/off mode) at a duty cycle of 30%. The system can be under gas (e.g., an inert gas such as argon gas). The monomer and gas flow rate was kept at 5-50 sccm, more preferably at 8-40 sccm, and even more preferably at 9-30 sccm. The monomers were vaporized into a plasma state in a quartz chamber, and then polymerized and deposited on the substrate in the deposition chamber. The substrates included four- or eight-inch flat wafers, topography wafers, quartz slides, aluminium substrates, tantalum (Ta) substrates, tantalum nitride (TaN) substrates, and dense patterned (1:1), semidense patterned (1:2), isolated patterned (1:4), and blank resist patterned 0.25 μm-sized via holes. The substrates were rotated at about 2-10 rpm, more preferably at about 4-8 rpm, and even more preferably at about 6 rpm in order to ensure uniform coating.

Example 4

Deposition of 2-Fluorotoluene by a PECVD Process

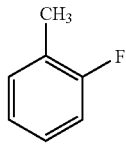

Organic, polymeric thin films were prepared by polymerizing 2-fluorotoluene (obtained from Sigma-Aldrich Company) onto four- or eight-inch flat silicon wafers, 7000 Å (1:1) topography wafers, dense patterned (1:1), semidense patterned (1:2), isolated patterned (1:4), and blank resist patterned 0.25 μm-sized via holes on quartz slides, aluminum substrates, Ta substrates, and TaN substrates by a PECVD process. An initial eight runs on flat substrates were conducted to determine the best film thickness, optical properties, film uniformity, intermixing with photoresist, resistance to resist solvents, and adhesion to the various substrates. The topography wafers were used to determine conformal properties. During deposition, the pressure was maintained around 75 mTorr, and the temperature was room temperature (about 23° C.). The RF plasma power was set at 35 watts. The gas flow rate was maintained at 15 sccm using argon gas, and the monomer flow rate was maintained at 15 sccm. The substrate was rotated at 6 rpm in order to ensure a uniform coat. The 2-fluorotoluene was deposited at a rate of 150 Å/min.

Example 5

Deposition of 3-Fluorotoluene by a PECVD Process

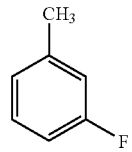

Organic, polymeric thin films were prepared by polymerizing 3-fluorotoluene (obtained from Sigma-Aldrich Company) onto six- or eight-inch flat silicon wafers, 7000 Å (1:1) topography wafers, dense patterned (1:1), semidense patterned (1:2), isolated patterned (1:4), and blank resist patterned 0.25 μm-sized via holes on quartz slides, aluminum substrates, Ta substrates, and TaN substrates by a PECVD process. During deposition, the pressure was maintained at around 25 mTorr, and the temperature was room temperature (about 23° C.). The RF plasma power was set at 70 watts with pulsing at 100/50 (on/off) msec. The monomer flow rate was maintained at 25 sccm. The substrate was rotated at 6 rpm in order to ensure a uniform coat. The 3-fluorotoluene was deposited at a rate of 135 Å/min.

Example 6

Deposition of 2-Ethyltoluene by a PECVD Process

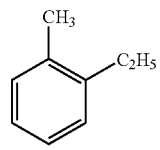

Organic, polymeric thin films were prepared by polymerizing 2-ethyltoluene (obtained from Sigma-Aldrich Company) onto six- or eight-inch flat silicon wafers, 7000 Å (1:1) topography wafers, dense patterned (1:1), semidense patterned (1:2), isolated patterned (1:4), and blank resist patterned 0.25 μm-sized via holes on quartz slides, aluminum substrates, Ta substrates, and TaN substrates by plasma enhanced chemical vapor deposition (PECVD) process. During deposition, the pressure was maintained around 55 mTorr, and the temperature was room temperature (about 23° C.). The RF plasma power was set at 20 watts with pulsing at 100/50 (on/off) msec. The gas flow rate was maintained at 10 sccm using argon gas, and the monomer flow rate was maintained at 10 sccm. The substrate was rotated at 6 rpm in order to ensure a uniform coat. The 2-ethyltoluene was deposited at a rate of 60 Å/min.

Example 7

Deposition of 3-Ethyltoluene by a PECVD Process

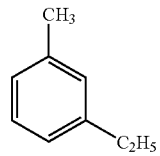

Organic, polymeric thin films were prepared by polymerizing 3-ethyltoluene (obtained from Sigma-Aldrich Company) onto six- or eight-inch flat silicon wafers, 7000 Å (1:1) topography wafers, dense patterned (1:1), semidense patterned (1:2), isolated patterned (1:4), and blank resist patterned 0.25 μm-sized via holes on quartz slides, aluminum substrates, Ta substrates, and TaN substrates by a PECVD process. During deposition, the pressure was maintained around 55 mTorr, and the temperature was room temperature (about 23° C.). The RF plasma power was set at 40 watts with pulsing at 100/50 (on/off) msec. The gas flow rate was maintained at 10 sccm using argon gas, and the monomer flow rate was maintained at 10 sccm. The substrate was rotated at 6 rpm in order to ensure a uniform coat. The 3-ethyltoluene was deposited at a rate of 80 Å/min.

Example 8

Deposition of o-Xylene by a PECVD Process

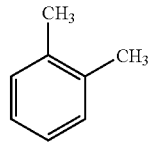

Organic, polymeric thin films were prepared by polymerizing o-xylene (obtained from Sigma-Aldrich Company) onto six- or eight-inch flat silicon wafers, 7000 Å (1:1) topography wafers, dense patterned (1:1), semidense patterned (1:2), isolated patterned (1:4), and blank resist patterned 0.25 μm-sized via holes on quartz slides, aluminum substrates, Ta substrates, and TaN substrates by a PECVD process. During deposition, the pressure was maintained around 50 mTorr, and the temperature was room temperature (about 23° C.). The RF plasma power was set at 35 watts with pulsing at 100/50 (on/off) msec. The gas flow rate was maintained at 9 sccm using argon gas, and the monomer flow rate was maintained at 9 sccm. The substrate was rotated at 6 rpm in order to ensure a uniform coat. The o-xylene was deposited at a rate of 60 Å/min.

Example 9

Deposition of m-Xylene by a PECVD Process

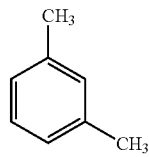

Organic, polymeric thin films were prepared by polymerizing m-xylene (obtained from Sigma-Aldrich Company) onto six- or eight-inch flat silicon wafers, 7000 Å (1:1) topography wafers, dense patterned (1:1), semidense patterned (1:2), isolated patterned (1:4), and blank resist patterned 0.25 μm-sized via holes on quartz slides, aluminum substrates, Ta substrates, and TaN substrates by a PECVD process. During deposition, the pressure was maintained around 50 mTorr, and the temperature was room temperature (about 23° C.). The RF plasma power was set at 35 watts with pulsing at 100/50 (on/off) msec. The gas flow rate was maintained at 9 sccm using argon gas, and the monomer flow rate was maintained at 9 sccm. The substrate was rotated at 6 rpm in order to ensure a uniform coat. The m-xylene was deposited at a rate of 100 Å/min.

Results and Discussion

The deposition parameters of the procedures described in Examples 4-9 are summarized in Table 7.

TABLE 7

| | Deposition Parameters | | | |
|---|---|---|---|---|
| Monomer | RF Power (watts) | Pressure (mTorr) | Monomer Flow Rate (sccm) | Argon Flow Rate (sccm) |
| 2-Fluorotoluene | 35 | 75 | 15 | 15 |
| 3-Fluorotoluene | 70 | 25 | 25 | — |
| 2-Ethyltoluene | 20 | 55 | 10 | 10 |
| 3-Ethyltoluene | 40 | 55 | 10 | 10 |
| o-Xylene | 35 | 50 | 9 | 9 |
| m-Xylene | 40 | 55 | 10 | 10 |

1. Example 4

The deposition rate of 2-fluorotoluene according to Example 4 was 150 Å/min, which is within the desired deposition range of the semiconductor industry standard for batch processing tools. The film thickness of 2-fluorotoluene was optically measured by ellipsometry at 25 points on a planar silicon wafer to estimate the mean thickness. The film of 2-fluorotoluene was deposited on silicon wafers at a thickness of 400 Å. The 2-fluorotoluene generated a uniform coating without pinholes, voids, or particles. The films exhibited a thickness uniformity of >90% on 4-inch and 8-inch silicon wafers.

The solubility of 2-fluorotoluene according to Example 4 was examined by treating the film with solvents typically used in the semiconductor industry. Very little thickness loss was observed using ethyl lactate or PGMEA. The stripping data is set forth in Table 8.

TABLE 8

| | Stripping Test | | | |
|---|---|---|---|---|
| Sample | Solvent | Initial Thickness (Å) | Final Thickness (Å) | Stripping (%) |
| 2-Fluorotoluene | PGMEA | 326.4 | 321.6 | 1.5 |
| 2-Fluorotoluene | Ethyl lactate | 312.4 | 306.0 | 2.0 |

Figure 11:
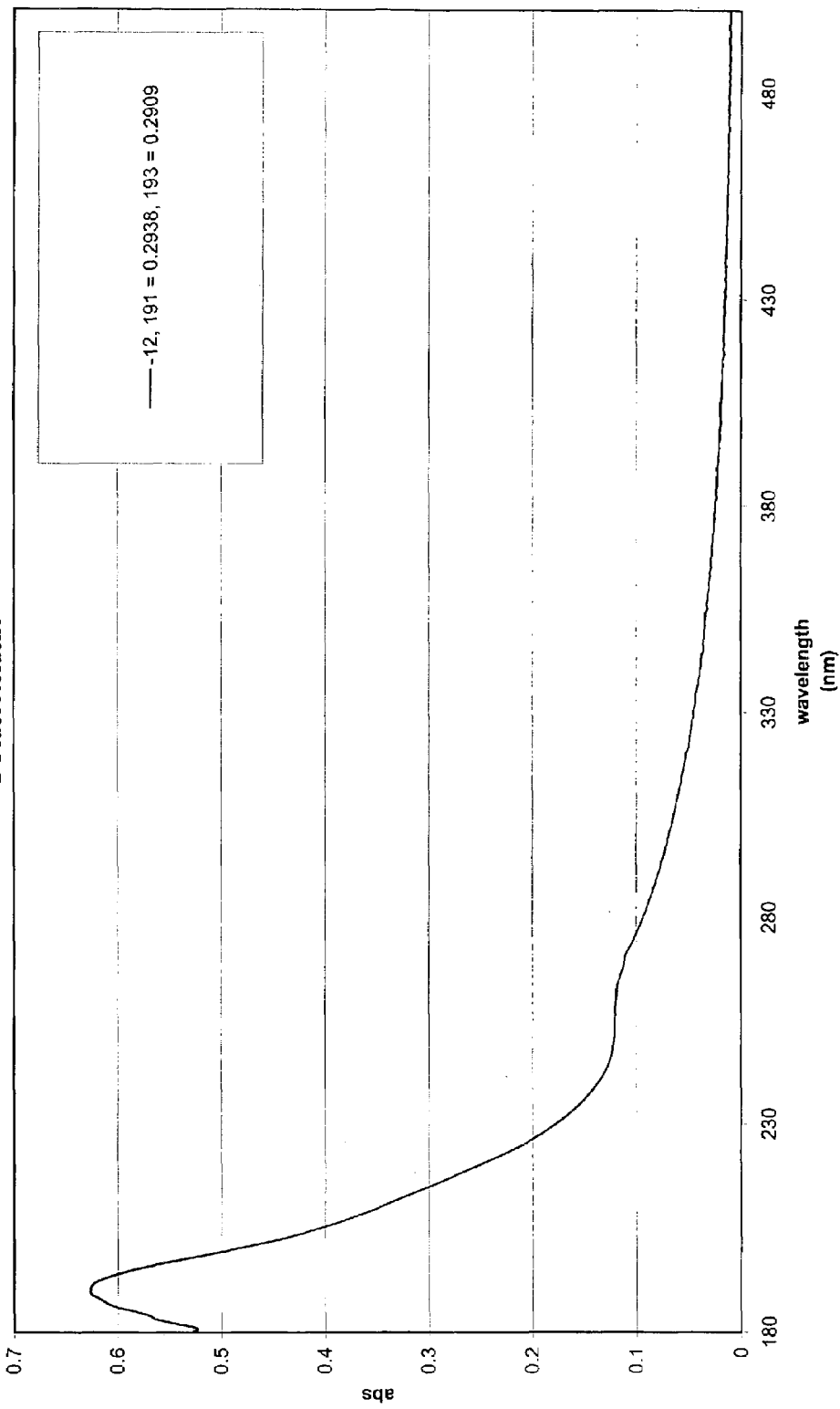
FIG. 11 is a graph showing the UV-Vis spectrum of a 2-fluorotoluene film deposited on a quartz slide by the inventive PECVD process.

FIG. 11 is a graph showing the UV-Vis spectrum of the film deposited on a quartz slide according to Example 4. The $\lambda_{max}$ was at 191 nm, thus demonstrating that 2-fluorotoluene-based antireflective films according to the invention are useful for 193 nm applications. The optical density of 2-fluorotoluene was 20.75/μm at 193 nm.

Figure 12:
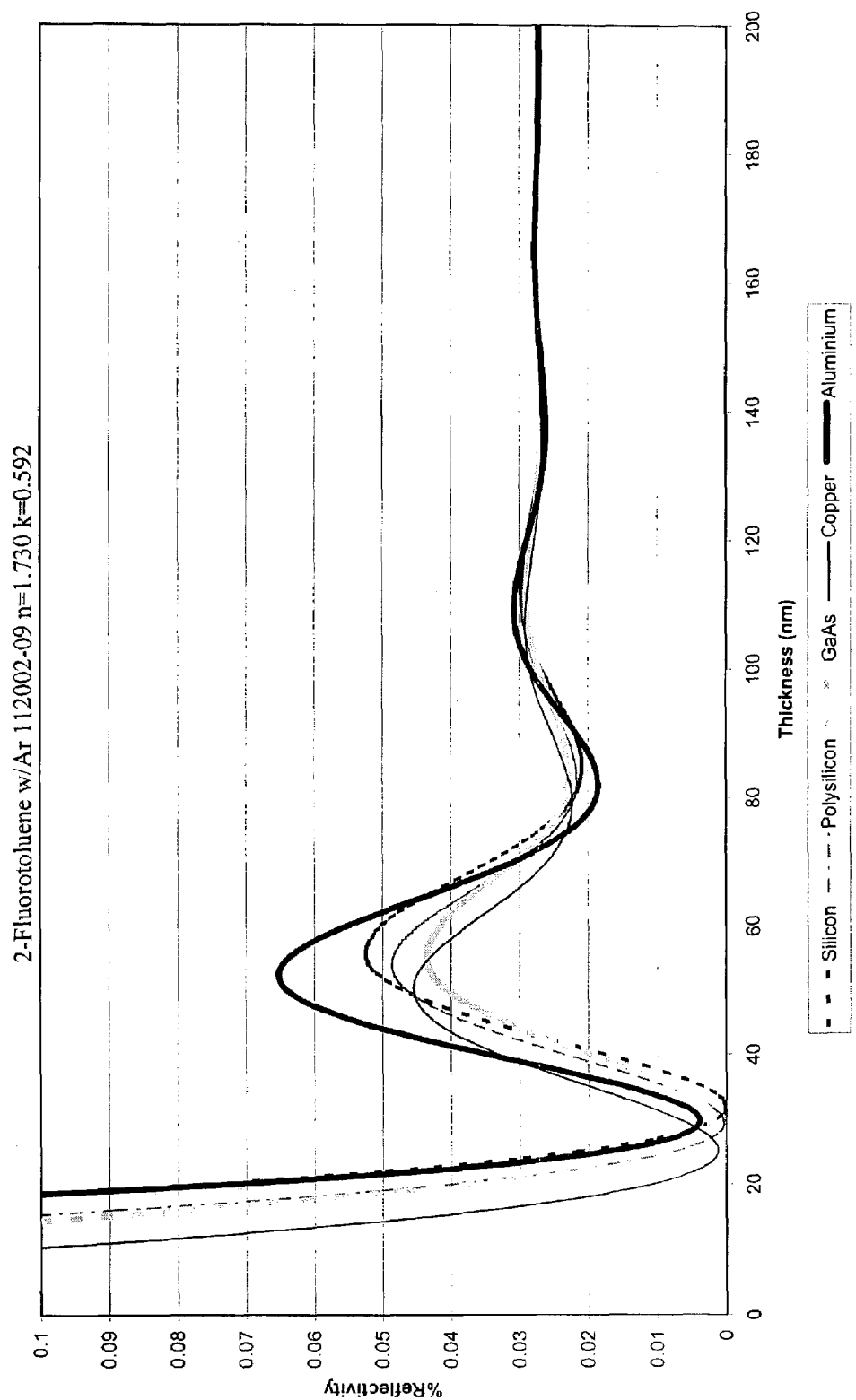
FIG. 12 is a graph showing the reflectance curve of a 2-fluorotoluene film deposited on various substrates by the inventive PECVD process.

The optical constants were measured by VASE analysis. The average real values of the refractive index (n) and the imaginary index (k) were determined. The values for 2-fluorotoluene were n=1.73 and k=0.592 at 193 nm. The optical density of 2-fluorotoluene was 20.75/μm at 193 nm. FIG. 12 is a graph showing the reflectance curve according to Example 4. The first minimum thickness was 320 Å, and the second minimum thickness was 820 Å. The first minimum thickness of 2-fluorotoluene showed 0% reflectance at 320 Å on a copper substrate.

Figure 13A:
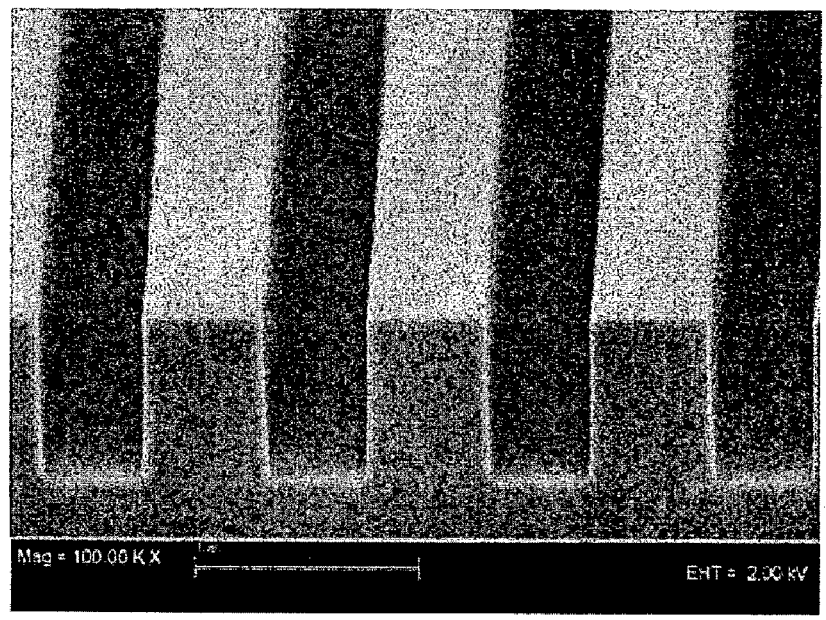
FIG. 13a is an SEM photograph showing the film conformality of a 200 Å thick, 2-fluorotoluene film deposited on 7000 Å (1:1) topography wafers by the inventive PECVD process.
Figure 13B:
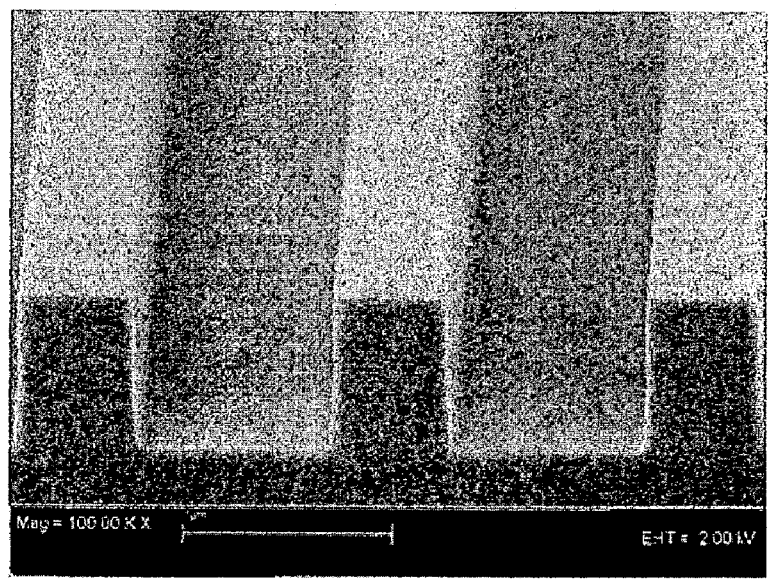
FIG. 13b is an SEM photograph showing the film conformality of a 200 Å thick, 2-fluorotoluene film deposited on 7000 Å (1:2) topography wafers by the inventive PECVD process.
Figure 13C:
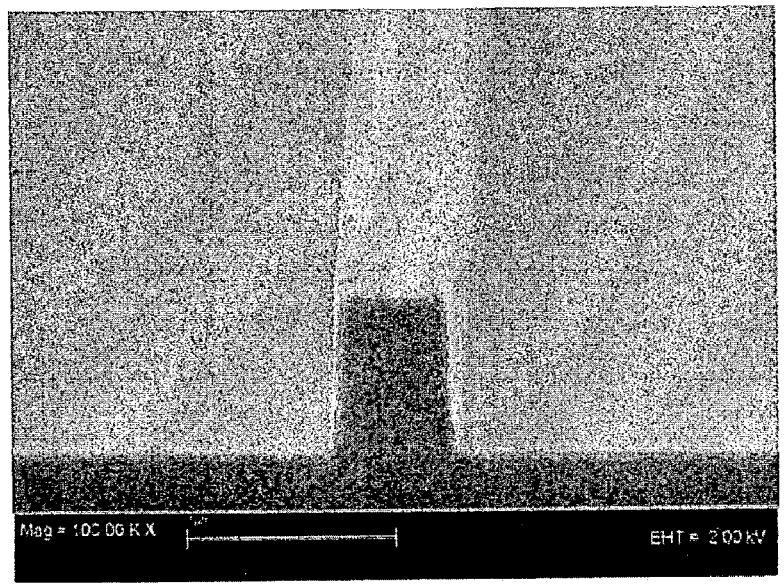
FIG. 13c is an SEM photograph showing the film conformality of a 200 Å thick, 2-fluorotoluene film deposited on 7000 Å (1:4) topography wafers by the inventive PECVD process.

Film conformality was tested by depositing 2-fluorotoluene on 7000 Å topography wafers. FIG. 13a is an SEM photograph showing the film conformality of a 200 Å thick film of 2-fluorotoluene on 7000 Å (1:1) topography wafers prepared according to the inventive PECVD process. FIG. 13b is an SEM photograph showing the film conformality of a 200 Å thick film of 2-fluorotoluene on 7000 Å (1:2) topography wafers prepared according to the inventive PECVD process. FIG. 13c is an SEM photograph showing the film conformality of a 200 Å thick film of 2-fluorotoluene on 7000 Å (1:4) topography wafers by the inventive PECVD process. An examination of the SEM photographs demonstrated that PECVD-deposited 2-fluorotoluene provides a greater than 98% conformal film.

Adhesion of a 2-fluorotoluene film prepared according to Example 4 was examined on various electronic substrates using the transparent tape peel test. PECVD-deposited, 2-fluorotoluene films showed excellent adhesion on all the substrates.

A film of 2-fluorotoluene on a silicon wafer (prepared according to Example 4) was examined under an optical microscope. No pinholes, striations, dewetting, comets, or particles were observed. The 2-fluorotoluene-based films were extremely uniform without any visible defects.

Figure 14:
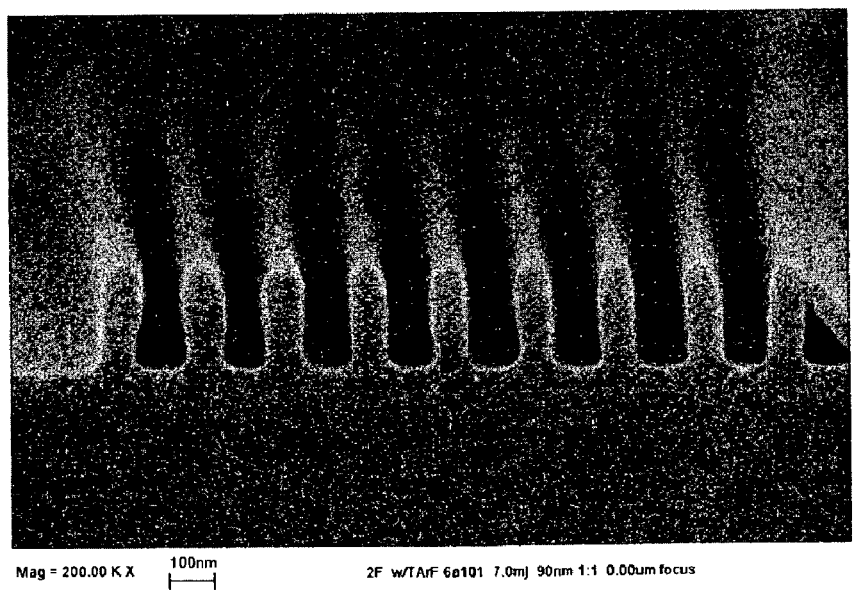
FIG. 14 is an SEM photograph showing the resist profile cross-section of a 2-fluorotoluene film deposited by the inventive PECVD process and utilizing a commercially available photoresist.

Photolithography of the 2-fluorotoluene on a silicon wafer, prepared according to Example 4 and having a film thickness of 380 Å, was performed using a TARF6a101 photoresist (from Tokyo Ohka Kogyo Co. Ltd., Japan), a JSRAR230J photoresist (from Japan Synthetic Rubber, Japan), and a GAR8105G photoresist (from Arch Chemicals inc., USA). The best results were achieved using TARF6a101 photoresist. The wafers were cross-sectioned, and the resist features were examined with a scanning electron microscope. FIG. 14 is an SEM photograph showing an excellent resist profile of the 2-fluorotoluene film using the TARF6a101 photoresist. Resist profiles as small as 90 nm dense lines were achieved.

2. Example 5

The deposition rate of 3-fluorotoluene according to Example 5 was 135 Å/min, which is within the desired deposition range of the semiconductor industry standard for batch processing tools. The film thickness of 3-fluorotoluene was optically measured by ellipsometry at 25 points on a planar silicon wafer to estimate the mean thickness. The film had a thickness of 966 Å. The films exhibited a thickness uniformity of >95% on 4-inch and 8-inch silicon wafers.

Figure 15:
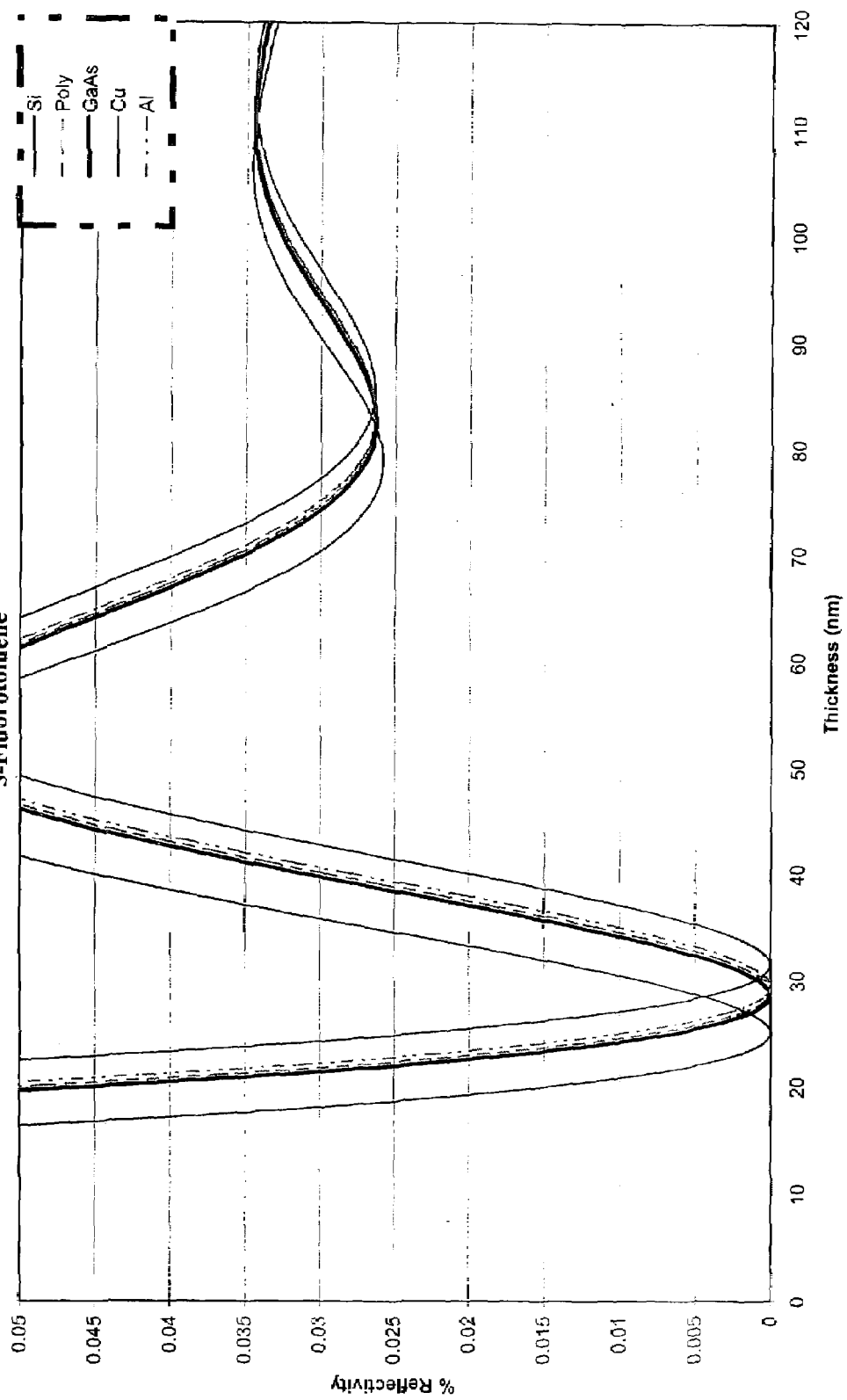
FIG. 15 is a graph showing the reflectance curve of a 3-fluorotoluene film deposited on various substrates by the inventive PECVD process.

The optical constants were measured by VASE analysis. The average real values of the refractive index (n) and the imaginary index (k) were studied. The values of the 3-fluorotoluene film were n=1.70 and k=0.67 at 193 nm. FIG. 15 is a graph depicting the reflectance curve according to Example 5. The first minimum thickness was 250 Å, and the second minimum thickness was 790 Å.

The film of 3-fluorotoluene deposited on a silicon wafer according to Example 5 was examined under an optical microscope. No pinholes, striations, dewetting, comets, or particles were observed. The 3-fluorotoluene-based films were extremely uniform without any visible defects.

3. Example 6

The deposition rate of 2-ethyltoluene according to Example 6 was 60 Å/min. which is within the desired deposition range of the semiconductor industry standard for batch processing tools.

The solubility of the 2-ethyltoluene film was examined by treating the film with solvents typically used in the semiconductor industry. Very little thickness loss was observed using PGMEA. The stripping data is set forth in Table 9.

TABLE 9

| | | Stripping Test | | |
|---|---|---|---|---|
| Sample | Solvent | Initial Thickness (Å) | Final Thickness (Å) | Stripping (%) |
| 2-ethyltoluene | PGMEA | 141.5 | 140.0 | 1.1 |

The optical constants were measured by VASE analysis. The average real values of the refractive index (n) and the imaginary index (k) were determined. The values were n=1.63 and k=0.49 at 193 nm. The film of 2-ethyltoluene on a silicon wafer (prepared according to Example 6) was examined under an optical microscope. No pinholes, striations, dewetting, comets, or particles were observed. The 2-ethyltoluene-based films were extremely uniform and without any visible defects.

4. Example 7

Figure 16:
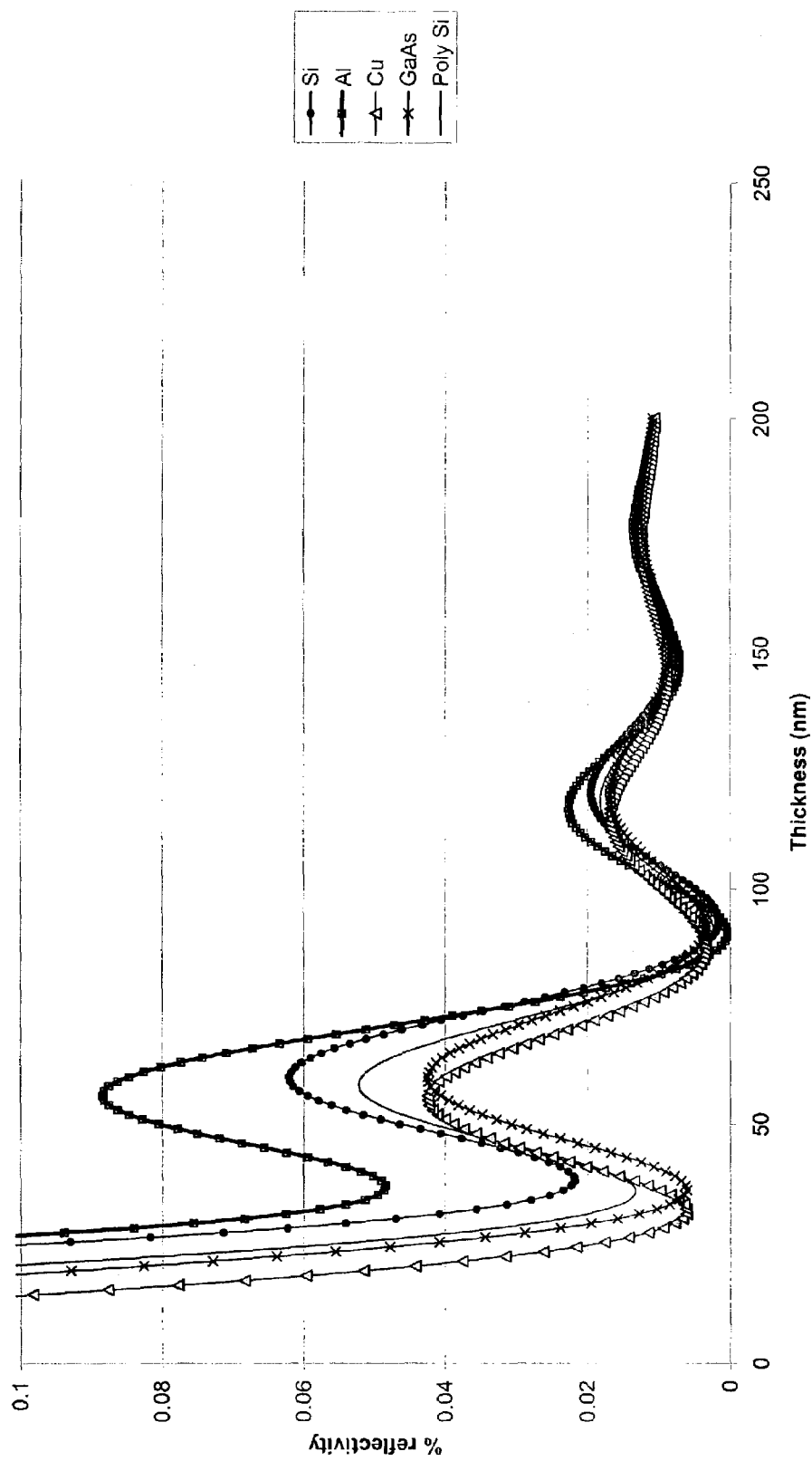
FIG. 16 is a graph showing the reflectance curve of a 3-ethyltoluene film deposited on various substrates by the inventive PECVD process.

The deposition rate of 3-ethyltoluene according to Example 7 was 80 Å/min, which is within the desired deposition range of the semiconductor industry standard for batch processing tools. The optical constants were measured by VASE analysis. The average real values of the refractive index (n) and the imaginary index (k) were n=1.65 and k=0.367 at 193 nm. FIG. 16 is a graph showing the reflectance curve of a sample prepared according to Example 7 using various substrates. The first minimum thickness was 320 Å, and the second minimum thickness was 820 Å.

The film of 3-ethyltoluene on a silicon wafer (prepared according to Example 7) was examined under an optical microscope. No pinholes, striations, dewetting, comets, or particles were observed. The 3-ethyltoluene-based films were extremely uniform and were without any visible defects.

5. Example 8

The deposition rate of o-xylene prepared as described in Example 8 was 80 Å/min which is within the deposition range of the semiconductor industry standard for batch processing tools. The solubility of the o-xylene film prepared in Example 8 was examined by treating the film with solvents typically used in the semiconductor industry. No thickness loss was observed using ethyl lactate or PGMEA. The stripping data is set forth in Table 10.

TABLE 10

| | | Stripping Test | | |
|---|---|---|---|---|
| Sample | Solvent | Initial Thickness (Å) | Final Thickness (Å) | Stripping (%) |
| o-Xylene | PGMEA | 358.5 | 357 | 0.5 |
| o-Xylene | Ethyl lactate | 367.5 | 357.5 | 3 |

Figure 17:
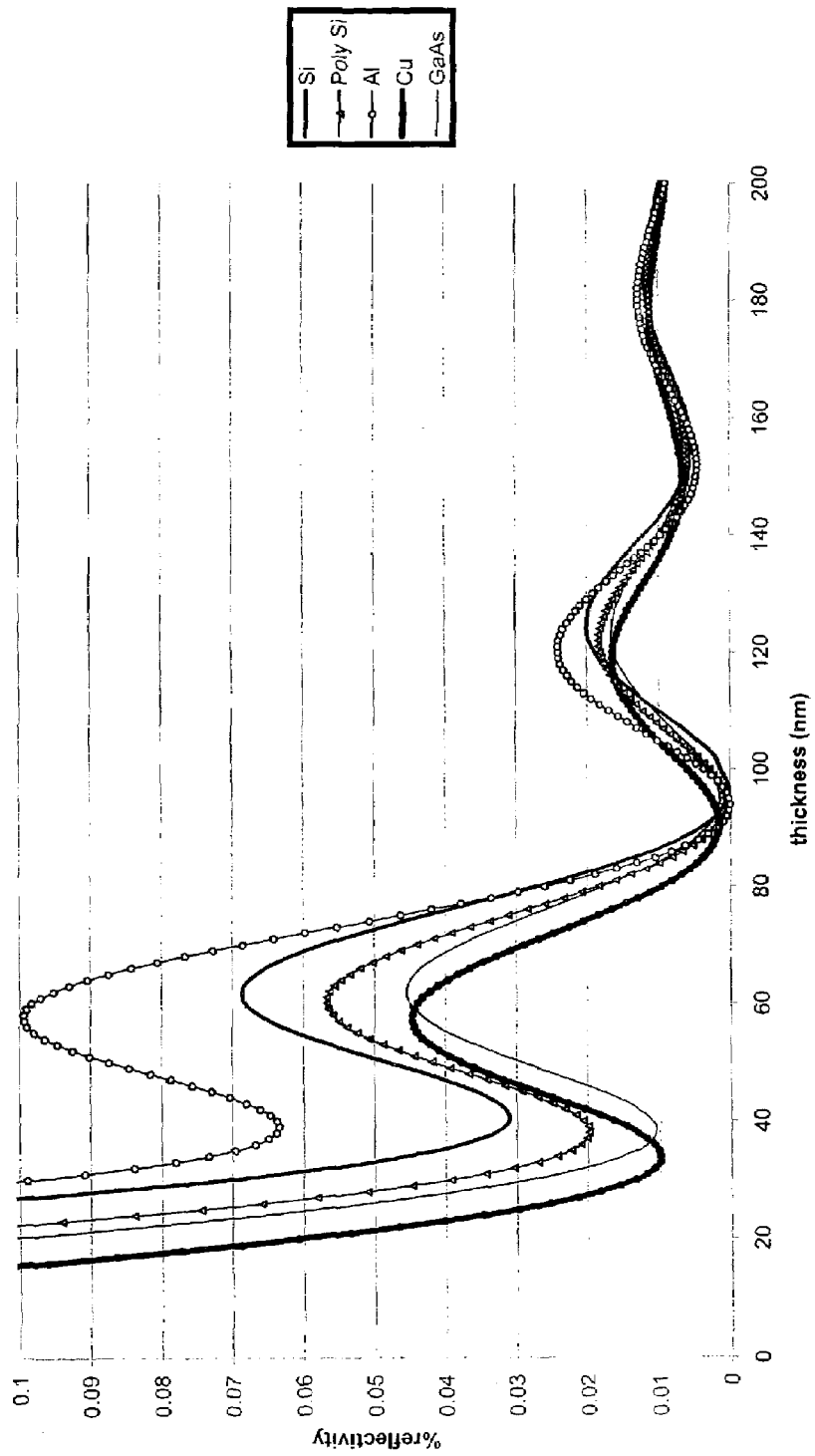
FIG. 17 is a graph showing the reflectance curve of an o-xylene film deposited on various substrates by the inventive PECVD process.

The optical constants were measured by VASE analysis. The average real values of the refractive index (n) and the imaginary index (k) were n=1.62 and k=0.334 at 193 nm. FIG. 17 is a graph showing the reflectance curve of a sample prepared according to Example 8 using various substrates.

The film of o-xylene deposited on a silicon wafer as described in Example 8 was examined under an optical microscope. No pinholes, striations, dewetting, comets, or particles were observed. The o-xylene-based films were extremely uniform and were without any visible defects.

6. Example 9

The deposition rate of m-xylene as described in Example 9 was 100 Å/min which is within the desired deposition range of the semiconductor industry standard for batch processing tools. The solubility of m-xylene was examined by treating the film with solvents typically used in the semiconductor industry. No thickness loss was observed using ethyl lactate or PGMEA. The stripping data is set forth in Table 11.

TABLE 11

| | | Stripping Test | | |
|---|---|---|---|---|
| Sample | Solvent | Initial Thickness (Å) | Final Thickness (Å) | Stripping (%) |
| m-Xylene | PGMEA | 432 | 428.5 | 1 |
| m-Xylene | Ethyl lactate | 442 | 441.5 | 1 |

The optical constants were measured by VASE analysis. The average real values of the refractive index (n) and the imaginary index (k) were n=1.62 and k=0.28 at 193 nm.

The film of m-xylene deposited on a silicon wafer as described in Example 9 was examined under an optical microscope. No pinholes, striations, dewetting, comets, or particles were observed. The m-xylene-based films were extremely uniform and were without any visible defects.

We claim:

1. A method of forming a precursor for use in manufacturing microelectronic, optoelectronic, photonic, or microelectromechanical system devices, said method comprising the steps of:
providing a quantity of monomers and a substrate having a surface onto which a coating layer is to be applied, said monomers having the formula

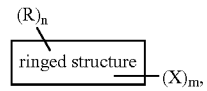

wherein:
each R is individually selected from the group consisting of alkyl groups;
each X is individually selected from the group consisting of cyano groups, nitroso groups, and the halogens;
m is 0-10; and
n is 1-12;
forming said monomers into a plasma; and
depositing said plasma monomers on said substrate surface so as to form the coating layer thereon.

2. The method of claim 1, wherein said ringed structure is selected from the group consisting of moieties of benzene, naphthalene, anthracene, acridine, furan, thiophene, pyrrole, pyridine, pyridazine, pyrimidine, pyrazine, thiazine, oxazine, thiazole, oxazole, pyrazole, oxadiazole, quinazoline, and quinoxaline.

3. The method of claim 2, wherein said monomer has the formula

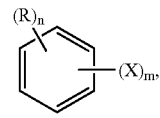

wherein:
each R is individually selected from the group consisting of alkyl groups;
each X is individually selected from the group consisting of cyano groups, nitroso groups, and the halogens;
m is 0-5;
n is 1-6; and
the sum of m and n is less than or equal to 6.

4. The method of claim 1, wherein each R is individually selected from the group consisting of $C_1$-$C_{20}$ alkyl groups.

5. The method of claim 4, wherein each R is individually selected from the group consisting of methyl, ethyl, n-propyl, iso-propyl, n-butyl, iso-butyl, pentyl, hexyl, heptyl, octyl, nonyl, decyl, dodecyl, and amyl groups.

6. The method of claim 1, wherein said monomers are selected from the group consisting of xylene, tolulene, and derivatives thereof.

7. The method of claim 6, wherein said monomers are selected from the group consisting of 2-fluorotoluene, 3-fluorotoluene, 4-fluorotoluene, 2-chlorotoluene, 3-chlorotoluene, 4-chlorotoluene, 2-bromotoluene, 3-bromotoluene, 4-bromotoluene, 2-iodotoluene, 3-iodotoluene, 4-iodotoluene, 2-ethyltoluene, 3-ethyltoluene, 4-ethyltoluene, 2-methoxytoluene, 3-methoxytoluene, 4-methoxytoluene, 3-nitrotoluene, 3-nitrotoluene, 4-nitrotoluene, o-xylene, m-xylene, p-xylene, 2-bromo-m-xylene, 2-bromo-p-xylene, 3-bromo-o-xylene, 4-bromo-o-xylene, 4-bromo-m-xylene, 5-bromo-m-xylene, 4-tert-butyltoluene, 4-tert-butyl-o-xylene, 5-tert-butyl-m-xylene, 2-chloro-3-nitrotoluene, 2-chloro-4-nitrotoluene, 2-chloro-6-nitrotoluene, 3-chloro-4-nitrotoluene, 4-chloro-2-nitrotoluene, 4-chloro-3-nitrotoluene, 5-chloro-2-nitrotoluene, 2-fluoro-4- nitrotoluene, 2-fluoro-5-nitrotoluene, 2-fluoro-6-nitrotoluene, 3-fluoro-4-nitrotoluene, 4-fluoro-2-nitrotoluene, 5-fluoro-2-nitrotoluene, 2-fluoro-m-xylene, 3-fluoro-o-xylene, 2-chloro-m-xylene, 2-chloro-p-xylene, 3-chloro-o-xylene, 4-chloro-o-xylene, and mixtures thereof.

8. The method of claim 1, further including the step of applying a photoresist layer to said coating layer to yield an integrated circuit precursor structure.

9. The method of claim 1, wherein said monomers have a melting or boiling point of less than about 450° C.

10. The method of claim 9, wherein said monomers have a melting or boiling point of less than about 100° C.

11. The method of claim 1, wherein said substrate is selected from the group consisting of silicon, aluminum, tungsten, tungsten silicide, gallium arsenide, germanium, tantalum, SiGe, and tantalum nitrite wafers.

12. The method of claim 1, wherein said plasma forming step comprises subjecting said monomers to an electric current and pressure.

13. The method of claim 12, wherein said electric current is from about 0.1-10 amps.

14. The method of claim 12, wherein said electric current is applied in pulses.

15. The method of claim 12, wherein said pressure is from about 5-200 mTorr.

16. The method of claim 1, wherein said coating layer on said substrate surface after said depositing step has a thickness of from about 100-5000 Å.

17. The method of claim 8, wherein said layer is substantially insoluble in solvents utilized in said photoresist layer.

18. The method of claim 8, further including the steps of:
exposing at least a portion of said photoresist layer to activating radiation;
developing said exposed photoresist layer; and
etching said developed photoresist layer.

19. The method of claim 1, wherein said coating layer deposited on said substrate surface is an antireflective layer which absorbs at least about 90% of light at a wavelength of from about 150-500 nm.

20. The method of claim 1, wherein said coating layer deposited on said substrate surface is an antireflective layer which has a k value of at least about 0.1 at light having a wavelength of about 193 nm.

21. The method of claim 1, wherein said coating layer deposited on said substrate surface is an antireflective layer which has an n value of at least about 1.1 at light having a wavelength of about 193 nm.

22. The method of claim 1, wherein said depositing step comprises depositing said monomers on said surface at a rate of at least about 100 Å/min. on an eight-inch round substrate.

23. The method of claim 1, wherein said plasma monomers polymerize during said depositing step.

24. A precursor structure formed during the process of manufacturing microelectronic, optoelectronic, photonic, or microelectromechanical system devices, said structure comprising:
a substrate having a surface; and
a coating layer on said surface, said coating layer being formed by the steps of:

providing a quantity of monomers having the formula

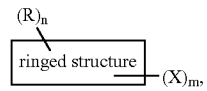

wherein:
each R is individually selected from the group consisting of alkyl groups;
each X is individually selected from the group consisting of cyano groups, nitroso groups, and the halogens;
m is 0-10; and
n is 1-12;
forming said monomers into a plasma; and
depositing said plasma monomers on said substrate surface so as to form the coating layer thereon.

25. The structure of claim 24, wherein said ringed structure is selected from the group consisting of moieties of benzene, naphthalene, anthracene, acridine, furan, thiophene, pyrrole, pyridine, pyridazine, pyrimidine, pyrazine, thiazine, oxazine, thiazole, oxazole, pyrazole, oxadiazole, quinazoline, and quinoxaline.

26. The structure of claim 25, wherein said monomer has the formula

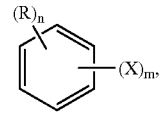

wherein:
each R is individually selected from the group consisting of alkyl groups;
each X is individually selected from the group consisting of cyano groups, nitroso groups, and the halogens;
m is 0-5;
n is 1-6; and
the sum of m and n is less than or equal to 6.

27. The structure of claim 24, wherein each R is individually selected from the group consisting of $C_1$-$C_{20}$ alkyl groups.

28. The structure of claim 27, wherein each R is individually selected from the group consisting of methyl, ethyl, n-propyl, iso-propyl, n-butyl, iso-butyl, pentyl, hexyl, heptyl, octyl, nonyl, decyl, dodecyl, and amyl groups.

29. The structure of claim 24, wherein said monomers are selected from the group consisting of xylene, tolulene, and derivatives thereof.

30. The structure of claim 29, wherein said monomers are selected from the group consisting of 2-fluorotoluene, 3-fluorotoluene, 4-fluorotoluene, 2-chlorotoluene, 3-chlorotoluene, 4-chlorotoluene, 2-bromotoluene, 3-bromotoluene, 4-bromotoluene, 2-iodotoluene, 3-iodotoluene, 4-iodotoluene, 2-ethyltoluene, 3-ethyltoluene, 4-ethyltoluene, 2-methoxytoluene, 3-methoxytoluene, 4-methoxytoluene, 3-nitrotoluene, 3-nitrotoluene, 4-nitrotoluene, o-xylene, m-xylene, p-xylene, 2-bromo-m-xylene, 2-bromo-p-xylene, 3-bromo-o-xylene, 4-bromo-o-xylene, 4-bromo-m-xylene, 5-bromo-m-xylene, 4-tert-butyltoluene, 4-tert-butyl-o-xylene, 5-tert-butyl-m-xylene, 2-chloro-3-nitrotoluene, 2-chloro-4-nitrotoluene, 2-chloro-6-nitrotoluene, 3-chloro-4- nitrotoluene, 4-chloro-2-nitrotoluene, 4-chloro-3-nitrotoluene, 5-chloro-2-nitrotoluene, 2-fluoro-4-nitrotoluene, 2-fluoro-5-nitrotoluene, 2-fluoro-6-nitrotoluene, 3-fluoro-4-nitrotoluene, 4-fluoro-2-nitrotoluene, 5-fluoro-2-nitrotoluene, 2-fluoro-m-xylene, 3-fluoro-o-xylene, 2-chloro-m-xylene, 2-chloro-p-xylene, 3-chloro-o-xylene, 4-chloro-o-xylene, and mixtures thereof.

31. The structure of claim 24, said structure further comprising a photoresist layer on said coating layer.

32. The structure of claim 24, wherein said substrate is selected from the group consisting of silicon, aluminum, tungsten, tungsten silicide, gallium arsenide, germanium, tantalum, SiGe, and tantalum nitrite wafers.

33. The structure of claim 24, wherein the antireflective coating layer on said substrate surface has a thickness of from about 100-5000 Å.

34. The structure of claim 31, wherein said antireflective coating layer is substantially insoluble in solvents utilized in said photoresist layer.

35. The structure of claim 24, wherein said coating layer is an antireflective layer which absorbs at least about 90% of light at a wavelength of from about 150-500 nm.

36. The structure of claim 24, wherein said coating layer is an antireflective layer which has a k value of at least about 0.1 at light having a wavelength of about 193 nm.

37. The structure of claim 24, wherein said coating layer is an antireflective layer which has an n value of at least about 1.1 at light having a wavelength of about 193 nm.

38. The structure of claim 24, wherein said coating layer has less than about 0.1 defects per $cm^2$ of substrate surface.

39. A method of forming a precursor for use in manufacturing integrated circuits comprising the steps of:
providing a quantity of monomers and a substrate having a surface onto which an antireflective coating is to be applied;
forming said monomers into a plasma;
depositing said plasma monomers on said substrate surface so as to form an antireflective coating layer; and
applying a photoresist layer to said antireflective coating layer to yield the circuit precursor.

40. The method of claim 39, wherein said monomers comprising a light attenuating moiety and an unsaturated moiety.

41. The method of claim 40, wherein said light attenuating moiety is a cyclic compound.

42. The method of claim 41, wherein said light attenuating moiety is selected from the group consisting of benzene, naphthalene, anthracene, acridine, furan, thiophene, pyrrole, pyridine, pyridazine, pyrimidine, and pyrazine.

43. The method of claim 41, wherein said light attenuating moiety comprises a group selected from the group consisting of cyano groups, nitroso groups, and halogens.

44. The method of claim 39, wherein said monomers have a melting or boiling point of less than about 200° C.

45. The method of claim 40, wherein said monomers are selected from the group consisting of styrene and substituted derivatives thereof, allylbenzene and substituted derivatives thereof.

46. The method of claim 40, wherein said monomers are selected from the group consisting of 2-methoxystyrene, 3-methoxystyrene, 4-methoxystyrene, 2-methylstyrene, 3-methylstyrene, 4-methylstyrene, 2-fluorostyrene, 3-fluorostyrene, 4-fluorostyrene, 2-bromostyrene, 3-bromostyrene, 4-bromostyrene, 2-chlorostyrene, 3-chlorostyrene, 4-chlorostyrene, 2-nitrostyrene, 3-nitrostyrene, 4-nitrostyrene, 3,5-bis(trifluoromethyl)styrene, trans-2-chloro-6-fluoro-β-nitrostyrene, decafluoroallylbenzene, 2,6-difluorostyrene, ethyl 7-[1-(4-fluorophenyl)-4-isopropyl-2-phenyl-1H-imidazol-5-yl)-5-hydroxy-3-oxo-trans-6-heptenoate, flunarizine dihydrochloride, trans-4-fluoro-β-nitrostyrene, 2-fluorostyrene, 3-fluorostyrene, β-nitro-4-(trifluoromethoxy)styrene, trans-β-nitro-2-(trifluoromethyl)styrene, trans-β-nitro-3-(trifluoromethyl)styrene, β-nitro-4-(trifluoromethyl)styrene, trans-2,3,4,5,6-pentafluoro-β-nitrostyrene, trans-1,1,1-trifluoro-4-(3-indolyl)-3-buten-2-one, a-(trifluoromethyl)-styrene, 2-(trifluoromethyl)styrene, 3-(trifluoromethyl)styrene, 4-(trifluoromethyl)-styrene, and 3,3,3-trifluoro-1-(phenylsulfonyl)-1-propene.

47. The method of claim 39, wherein said substrate is selected from the group consisting of silicon, aluminum, tungsten, tungsten silicide, gallium arsenide, germanium, tantalum, SiGe, and tantalum nitrite wafers.

48. The method of claim 39, wherein said plasma forming step comprises subjecting said antireflective compound to an electric current and pressure.

49. The method of claim 48, wherein said electric current is from about 0.1-10 amps.

50. The method of claim 48, wherein said electric current is applied in pulses.

51. The method of claim 48, wherein said pressure is from about 50-200 mTorr.

52. The method of claim 39, wherein the antireflective coating layer on said substrate surface after said depositing step has a thickness of from about 300-5000 Å.

53. The method of claim 39, wherein said antireflective coating layer is substantially insoluble in solvents utilized in said photoresist layer.

54. The method of claim 39, further including the steps of:
exposing at least a portion of said photoresist layer to activating radiation;
developing said exposed photoresist layer; and
etching said developed photoresist layer.

55. The method of claim 39, wherein the antireflective coating layer deposited on said substrate surface absorbs at least about 90% of light at a wavelength of from about 150-500 nm.

56. The method of claim 39, wherein the antireflective coating layer has a k value of at least about 0.1 at light of a wavelength of 193 nm.

57. The method of claim 39, wherein the antireflective coating layer has an n value of at least about 1.1 at light of a wavelength of 193 nm.

58. The method of claim 39, wherein the rate of deposition of said monomers on said surface is at least about 100 Å/min. on an eight-inch round substrate.

59. The method of claim 39, wherein said plasma monomers polymerize during said depositing step.

60. A precursor structure formed during the course of the integrated circuit manufacturing process, said structure comprising:
a substrate having a surface;
an antireflective coating layer on said surface, said antireflective coating layer being formed on said surface by a plasma enhanced chemical vapor deposition process; and wherein said antireflective coating layer comprises a polymer includes recurring monomers comprising a light attenuating moiety and an unsaturated moiety; and
a photoresist layer on said antireflective coating layer.

61. The structure of claim 60, wherein said antireflective coating layer consists essentially of a polymer includes recurring monomers comprising a light attenuating moiety and an unsaturated moiety.

62. The structure of claim 60, wherein said light attenuating moiety is a cyclic compound.

63. The structure of claim 62, wherein said light attenuating moiety is selected from the group consisting of benzene, naphthalene, anthracene, acridine, furan, thiophene, pyrrole, pyridine, pyridazine, pyrimidine, and pyrazine.

64. The structure of claim 62, wherein said light attenuating moiety comprises a group selected from the group consisting of cyano groups, nitroso groups, and halogens.

65. The structure of claim 60, wherein said monomers are selected from the group consisting of styrene and substituted derivatives thereof, allylbenzene and substituted derivatives thereof.

66. The structure of claim 60, wherein said monomers are selected from the group consisting of 2-methoxystyrene, 3-methoxystyrene, 4-methoxystyrene, 2-methylstyrene, 3-methylstyrene, 4-methylstyrene, 2-fluorostyrene, 3-fluorostyrene, 4-fluorostyrene, 2-bromostyrene, 3-bromostyrene, 4-bromostyrene, 2-chlorostyrene, 3-chlorostyrene, 4-chlorostyrene, 2-nitrostyrene, 3-nitrostyrene, 4-nitrostyrene, 3,5-bis(trifluoromethyl)styrene, trans-2-chloro-6-fluoro-β-nitrostyrene, decafluoroallylbenzene, 2,6-difluorostyrene, ethyl 7-[1-(4-fluorophenyl)-4-isopropyl-2-phenyl-1H-imidazol-5-yl)-5-hydroxy-3-oxo-trans-6-heptenoate, flunarizine dihydrochloride, trans-4-fluoro-13-nitrostyrene, 2-fluorostyrene, 3-fluorostyrene, β-nitro-4-(trifluoromethoxy)styrene, trans-β-nitro-2-(trifluoromethyl)styrene, trans-β-nitro-3-(trifluoromethyl)styrene, β-nitro-4-(trifluoromethyl)styrene, trans-2,3,4,5,6-pentafluoro-β-nitrostyrene, trans-1,1,1-trifluoro-4-(3-indolyl)-3-buten-2-one, a-(trifluoromethyl)-styrene, 2-(trifluoromethyl)styrene, 3-(trifluoromethyl)styrene, 4-(trifluoromethyl)-styrene, and 3,3,3-trifluoro-1-(phenylsulfonyl)-1-propene.

67. A precursor structure formed during the course of the integrated circuit manufacturing process, said structure comprising:
a substrate having a surface, wherein said substrate is selected from the group consisting of silicon, aluminum, tungsten, tungsten silicide, gallium arsenide, germanium, tantalum, SiGe, and tantalum nitrite wafers;
an antireflective coating layer on said surface, said antireflective coating layer being formed on said surface by a plasma enhanced chemical vapor deposition process; and
a photoresist layer on said antireflective coating layer.

68. A precursor structure formed during the course of the integrated circuit manufacturing process, said structure comprising:
a substrate having a surface;
an antireflective coating layer on said surface, said antireflective coating layer being formed on said surface by a plasma enhanced chemical vapor deposition process, wherein said antireflective coating layer on said surface has a thickness of from about 300–5000 Å; and
a photoresist layer on said antireflective coating layer.

69. A precursor structure formed during the course of the integrated circuit manufacturing process, said structure comprising:
a substrate having a surface;
an antireflective coating layer on said surface, said antireflective coating layer being formed on said surface by a plasma enhanced chemical vapor deposition process, wherein said antireflective coating layer is substantially insoluble in solvents utilized in said photoresist layer; and
a photoresist layer on said antireflective coating layer.

70. A precursor structure formed during the course of the integrated circuit manufacturing process, said structure comprising:
a substrate having a surface;
an antireflective coating layer on said surface, said antireflective coating layer being formed on said surface by a plasma enhanced chemical vapor deposition process, wherein said antireflective coating layer absorbs at least about 90% of light at a wavelength of from about 150–500 nm; and
a photoresist layer on said antireflective coating layer.

71. A precursor structure formed during the course of the integrated circuit manufacturing process, said structure comprising:
a substrate having a surface;
an antireflective coating layer on said surface, said antireflective coating layer being formed on said surface by a plasma enhanced chemical vapor deposition process, wherein said antireflective coating layer has a k value of at least about 0.1 at light of a wavelength of 193 nm; and
a photoresist layer on said antireflective coating layer.

72. A precursor structure formed during the course of the integrated circuit manufacturing process, said structure comprising:
a substrate having a surface
an antireflective coating layer on said surface, said antireflective coating layer being formed on said surface by a plasma enhanced chemical vapor deposition process, wherein said antireflective coating layer has a n value of at least about 1.1 at light of a wavelength of 193 nm; and
a photoresist layer on said antireflective coating layer.

* * * * *

UNITED STATES PATENT AND TRADEMARK OFFICE
CERTIFICATE OF CORRECTION

| | |
|---|---|
| PATENT NO. | : 7,132,219 B2 |
| APPLICATION NO. | : 10/411046 |
| DATED | : November 7, 2005 |
| INVENTOR(S) | : Sabnis et al. |

It is certified that error appears in the above-identified patent and that said Letters Patent is hereby corrected as shown below:

Please insert the following language at column 1, line 5:

FEDERALLY SPONSORED RESEARCH/DEVELOPMENT PROGRAM

This invention was made with Government support under contract DASG60-01-C-0047 awarded by the United States Army Space and Missile Defense Command. The Government has certain rights in the invention.

Signed and Sealed this

Ninth Day of January, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,132,219 B2 | Page 1 of 1 |
| APPLICATION NO. | : 10/411046 | |
| DATED | : November 7, 2006 | |
| INVENTOR(S) | : Sabnis et al. | |

It is certified that error appears in the above-identified patent and that said Letters Patent is hereby corrected as shown below:

Please insert the following language at column 1, line 5:

FEDERALLY SPONSORED RESEARCH/DEVELOPMENT PROGRAM

This invention was made with Government support under contract DASG60-01-C-0047 awarded by the United States Army Space and Missile Defense Command. The Government has certain rights in the invention.

This certificate supersedes Certificate of Correction issued January 9, 2007.

Signed and Sealed this

Sixth Day of February, 2007

JON W. DUDAS
*Director of the United States Patent and Trademark Office*